(12) United States Patent
Hirano et al.

(10) Patent No.: US 10,388,834 B2
(45) Date of Patent: Aug. 20, 2019

(54) NITRIDE SEMICONDUCTOR WAFER, MANUFACTURING METHOD THEREOF, NITRIDE SEMICONDUCTOR ULTRAVIOLET LIGHT-EMITTING ELEMENT, AND NITRIDE SEMICONDUCTOR ULTRAVIOLET LIGHT-EMITTING DEVICE

(71) Applicants: Soko Kagaku Co., Ltd., Ishikawa (JP); AGC INC., Tokyo (JP)

(72) Inventors: Akira Hirano, Aichi (JP); Ko Aosaki, Tokyo (JP)

(73) Assignees: SOKO KAGAKU CO., LTD., Ishikawa (JP); AGC INC., Tokyo (JP)

( * ) Notice: Subject to any disclaimer, the term of this patent is extended or adjusted under 35 U.S.C. 154(b) by 0 days.

(21) Appl. No.: 15/736,253

(22) PCT Filed: Aug. 2, 2016

(86) PCT No.: PCT/JP2016/072638
§ 371 (c)(1),
(2) Date: Dec. 13, 2017

(87) PCT Pub. No.: WO2017/022754
PCT Pub. Date: Feb. 9, 2017

(65) Prior Publication Data
US 2018/0190877 A1 Jul. 5, 2018

(30) Foreign Application Priority Data
Aug. 3, 2015 (JP) .................................. 2015-153698

(51) Int. Cl.
*H01L 33/00* (2010.01)
*H01L 33/44* (2010.01)
(Continued)

(52) U.S. Cl.
CPC ............ *H01L 33/44* (2013.01); *H01L 21/288* (2013.01); *H01L 33/0075* (2013.01);
(Continued)

(58) Field of Classification Search
CPC ... H01L 33/44; H01L 21/288; H01L 33/0075; H01L 33/32; H01L 33/382; H01L 33/56
See application file for complete search history.

(56) References Cited

U.S. PATENT DOCUMENTS 9,537,073 B2 * 1/2017 Shih .................... H01L 33/62
2006/0138443 A1 6/2006 Fan et al.
(Continued)

FOREIGN PATENT DOCUMENTS

JP 2001119068 A 4/2001
JP 2006348088 A 12/2006
(Continued)

OTHER PUBLICATIONS

Nagamatsu, Kentaro et al., "High-efficiency AlGaN-based UV light-emitting diode on laterally overgrown AlN", Journal of Crystal Growth, 2008, 310, pp. 2326-2329.
(Continued)

*Primary Examiner* — Mounir S Amer
*Assistant Examiner* — Alexander Belousov
(74) *Attorney, Agent, or Firm* — Haynes Beffel & Wolfeld LLP

(57) ABSTRACT

To prevent degradation of electrical characteristics caused by a resin filled between electrodes in an ultraviolet light-emitting operation, there is provided a nitride semiconductor wafer having ultraviolet light-emitting elements on a substrate 12, each element including a semiconductor laminated portion 21 constituted by an n-type AlGaN layer 16, an active layer 17 composed of an AlGaN layer, and p-type AlGaN layers 19 and 20, an n-electrode 23, a p-electrode 22,
(Continued)

a protective insulating film 24, first and second plated electrodes 25 and 26, and a fluororesin film 27. The p-electrode is formed on an upper surface of the p-type AlGaN layer in the first region R1 and the n-electrode is formed on an upper surface of the n-type AlGaN layer in the second region R2. The protective insulating film has openings for exposing at least parts of the n-electrode and the p-electrode. The first plated electrode is spaced apart from the second plated electrode, contacts the p-electrode, and covers an upper surface and an entire outer circumferential side surface of the first region R1 and a part of the second region R2 that contacts the first region R1. The second plated electrode contacts the n-electrode and the fluororesin film 27 covers side wall surfaces of the first and second plated electrodes and a bottom surface of a gap part 31.

20 Claims, 21 Drawing Sheets

(51) Int. Cl.
  H01L 21/288   (2006.01)
  H01L 33/56    (2010.01)
  H01L 33/32    (2010.01)
  H01L 33/38    (2010.01)
(52) U.S. Cl.
  CPC ............. *H01L 33/32* (2013.01); *H01L 33/38* (2013.01); *H01L 33/382* (2013.01); *H01L 33/56* (2013.01); *H01L 2933/005* (2013.01); *H01L 2933/0016* (2013.01); *H01L 2933/0025* (2013.01)

(56) References Cited

U.S. PATENT DOCUMENTS

| | | | |
|---|---|---|---|
| 2007/0267645 A1 | 11/2007 | Nakata et al. | |
| 2011/0300651 A1* | 12/2011 | Kojima | H01L 33/0079 438/29 |
| 2015/0034985 A1 | 2/2015 | Tomizawa et al. | |
| 2015/0243856 A1 | 8/2015 | Yamada et al. | |
| 2017/0229614 A1* | 8/2017 | Kim | H01L 33/52 |

FOREIGN PATENT DOCUMENTS

| | | |
|---|---|---|
| JP | 2007527123 A | 9/2007 |
| JP | 2007311707 A | 11/2007 |
| JP | 2012164938 A | 8/2012 |
| JP | 2015032621 A | 2/2015 |
| WO | 2005091848 A2 | 10/2005 |
| WO | 2014178288 A1 | 11/2014 |

OTHER PUBLICATIONS

Sumiya, Shigeaki et al., "AlGaN-Based Deep Ultraviolet Light-Emitting Diodes Grown on Epitaxial AlN/Sapphire Templates," Japanese Journal of Applied Physics, vol. 47, No. 1, 2008, pp. 43-46.

* cited by examiner

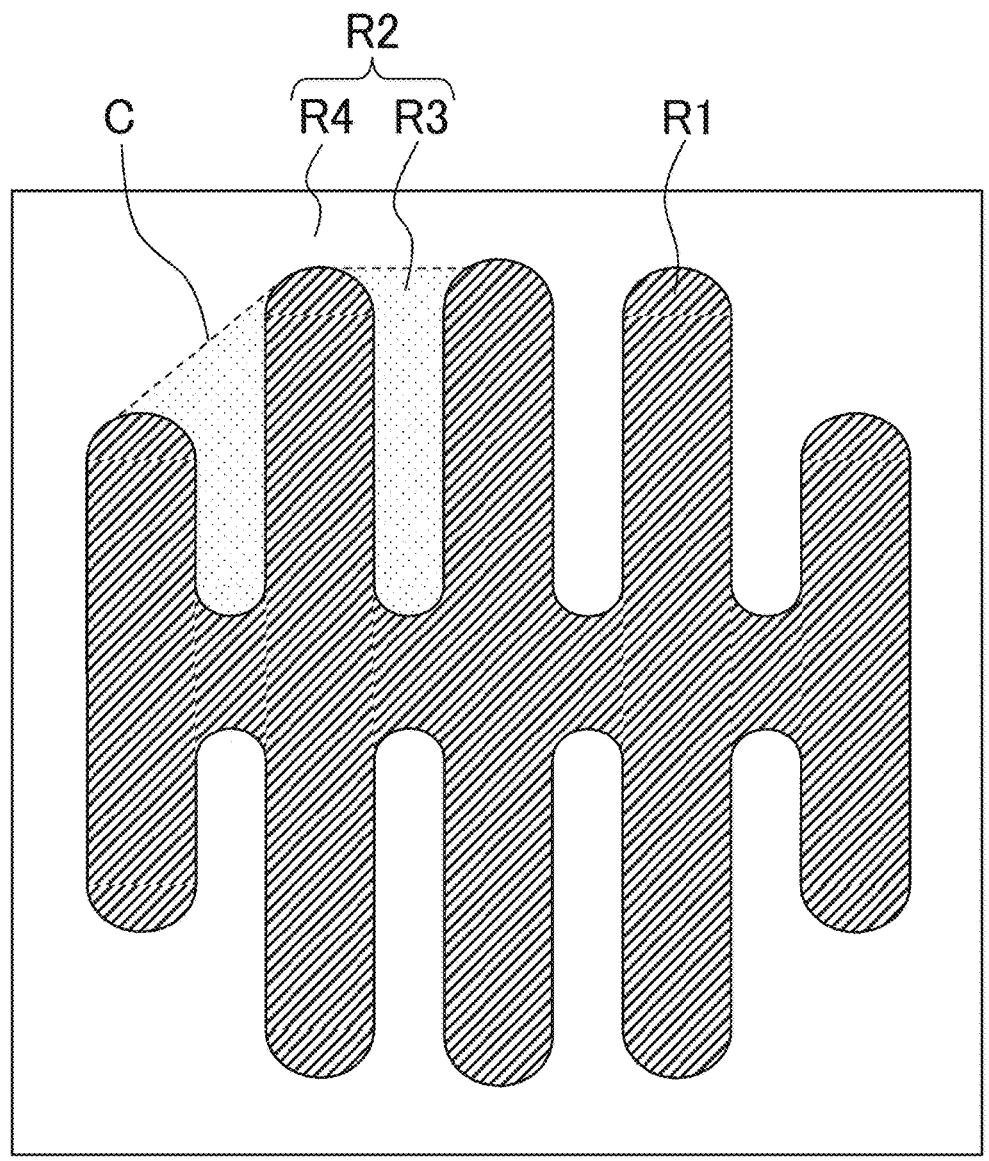
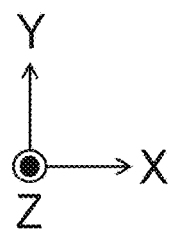
Fig. 7

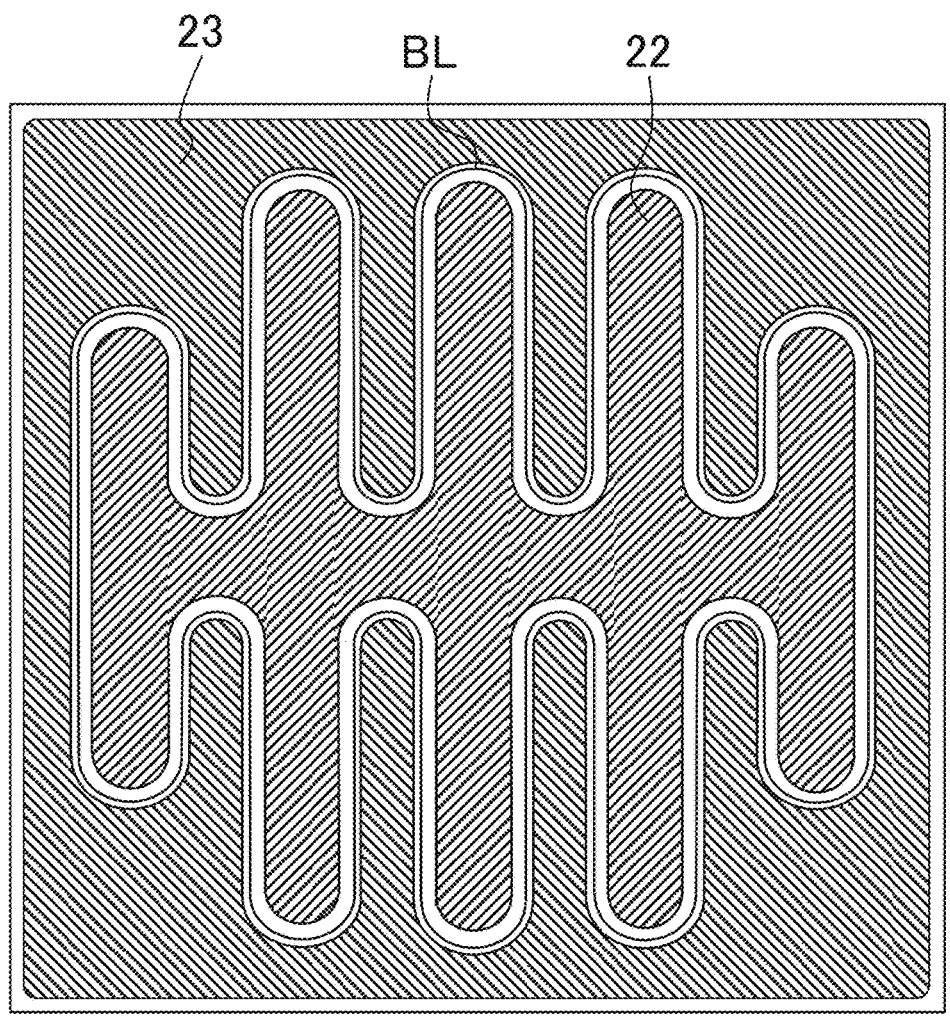
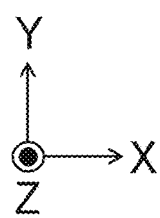
Fig. 8

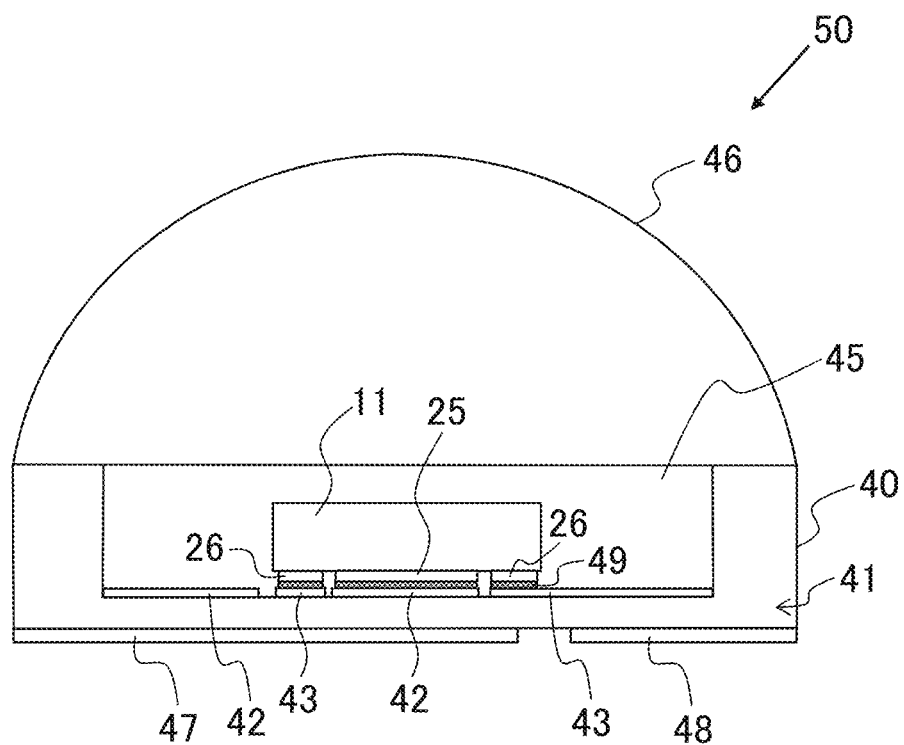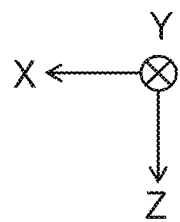
Fig. 18

NITRIDE SEMICONDUCTOR WAFER, MANUFACTURING METHOD THEREOF, NITRIDE SEMICONDUCTOR ULTRAVIOLET LIGHT-EMITTING ELEMENT, AND NITRIDE SEMICONDUCTOR ULTRAVIOLET LIGHT-EMITTING DEVICE

TECHNICAL FIELD

The present invention relates to a nitride semiconductor wafer, a manufacturing method thereof, a nitride semiconductor ultraviolet light-emitting element, and a nitride semiconductor ultraviolet light-emitting device obtained by mounting the nitride semiconductor ultraviolet light-emitting element on a base. In particular, the present invention relates to an improved technique of the electrode structure of a nitride semiconductor ultraviolet light-emitting element for flip-chip mounting in which light emission having an emission center wavelength of approximately 365 nm or less is extracted from the substrate side.

BACKGROUND ART

Conventionally, there are a large number of nitride semiconductor light-emitting elements such as LEDs (light-emitting diodes) or semiconductor lasers in which a light-emitting structure constituted by a plurality of nitride semiconductor layers is formed on a substrate such as sapphire by epitaxial growth (for example, see the following Non-Patent Documents 1 and 2). The nitride semiconductor layer is represented by the general formula $Al_{1-x-y}Ga_xIn_yN$ ($0 \leq x \leq 1$, $0 \leq y \leq 1$, $0 \leq x+y \leq 1$).

The light-emitting element structure has a double heterostructure in which an active layer is interposed between an n-type nitride semiconductor layer and a p-type nitride semiconductor layer. The active layer is constituted by a nitride semiconductor layer having a single-quantum-well (SQW) structure or a multi-quantum-well (MQW) structure. When the active layer is an AlGaN based semiconductor layer, it is possible to regulate a band gap energy within a range, lower and upper limits of which are band gap energies that can be taken by GaN and AlN respectively (approximately 3.4 eV and approximately 6.2 eV) by adjusting an AlN molar fraction (also referred to as an Al composition ratio). Thus, it is possible to obtain an ultraviolet light-emitting element having an emission wavelength of approximately 200 nm to 365 nm. Specifically, as a forward current flows from the p-type nitride semiconductor layer to the n-type nitride semiconductor layer, light emission equivalent to the band gap energy occurs in the active layer.

Meanwhile, flip-chip mounting has been generally employed as a way of mounting a nitride semiconductor ultraviolet light-emitting element (for example, see FIG. 4 and the like in the following Patent Document 1). In the flip-chip mounting, light emission from an active layer is transmitted through an AlGaN based nitride semiconductor, a sapphire substrate, and the like having a larger band gap energy than the active layer to be extracted from the element. Consequently, in the flip-chip mounting, the sapphire substrate is faced upward, p- and n-electrode surfaces formed on the upper surface of a chip are faced downward, and the electrode surfaces on the chip are electrically and physically bonded via metal bumps formed on the electrode surfaces to electrode pads on a package component such as a submount.

Generally, as disclosed in FIGS. 4, 6, 7, and the like in the following Patent Document 2 or FIGS. 2, 4, 6, and the like in the following Patent document 3, the nitride semiconductor ultraviolet light-emitting element is practically used in a state of being sealed with an ultraviolet-transmitting resin such as a fluorine-based resin or a silicone resin. The sealing resin protects an ultraviolet light-emitting element within the resin from the outside atmosphere and prevents degradation of the light-emitting element caused by the entrance of water, oxidization, or the like. Moreover, the sealing resin is sometimes provided as a refractive-index reducing material that reduces the light reflection loss caused by the refractive index difference between a collecting lens and the ultraviolet light-emitting element or the refractive index difference between the ultraviolet irradiation space and the ultraviolet light-emitting element to improve light extraction efficiency. In addition, the surface of the sealing resin may be formed in a light-collecting curved surface such as a spherical surface, for the purpose of improving the irradiation efficiency.

PRIOR ART DOCUMENTS

Patent Documents

Patent Document 1: WO2014/178288 A
Patent Document 2: JP 2007-311707 A
Patent Document 3: US 2006/0,138,443 A
Patent Document 4: JP 2006-348088 A Non-Patent Documents Non-Patent Document 1: Kentaro Nagamatsu, et al., "High-efficiency AlGaN-based UV light-emitting diode on laterally overgrown AlN", Journal of Crystal Growth, 2008, 310, pp. 2326-2329
Non-Patent Document 2: Shigeaki Sumiya, et al., "AlGaN-Based Deep Ultraviolet Light-Emitting Diodes Grown on Epitaxial AlN/Sapphire Templates", Japanese Journal of Applied Physics, Vol. 47, No. 1, 2008, pp. 43-46

SUMMARY OF THE INVENTION

Problems to be Solved by the Invention

As described above, it has been proposed to use a fluorine-based resin, a silicone resin, or the like as a resin for sealing an ultraviolet light-emitting element. However, it has been found that if the silicone resin is exposed to a large amount of high energy ultraviolet light, degradation of the silicone resin is prompted. In particular, there has been demanded higher output of the ultraviolet light-emitting element and thus the degradation of the sealing resin caused by exposure to the ultraviolet light tends to be accelerated. Additionally, the amount of generated heat is also increased by the increase in consumption power according to higher output, which also leads to the degradation of the sealing resin.

While it has been known that the fluorine-based resin has high thermal resistance and high ultraviolet resistance, a general fluororesin such as polytetrafluoroethylene is opaque. The fluorine-based resin has rectilinear and rigid polymer chains and is easily crystallized. Consequently, there are a crystalline part and an amorphous part in a mixed manner in the fluororesin. Light scatters on the interface between the crystalline part and the amorphous part and thus the fluororesin is opaque.

For example, it is proposed in Patent Document 4 that an amorphous (non-crystalline) fluororesin is used as the sealing resin of an ultraviolet light-emitting element for the purpose of enhancing the transparency of the fluororesin to ultraviolet light. Examples of the amorphous fluororesin include an amorphized polymer alloy obtained by copolymerizing a fluororesin of a crystalline polymer, a copolymer of perfluoro dioxole (Trade Name "Teflon® AF" by Du Pont), and a cyclized polymer of perfluoro butenyl vinyl ether (Trade Name "CYTOP®" by Asahi Glass Co., Ltd.). The fluororesin of a cyclized polymer has a cyclic main chain structure and thus is easily amorphized. As a result, the fluororesin has high transparency.

There are roughly two types of the amorphous fluororesin: a bonding fluororesin having a functional group bondable to metal and a non-bonding fluororesin having a functional group that is hardly bonded to metal. If the bonding fluororesin is used for covering a surface of a base on which an LED chip is mounted and the LED chip, it is possible to increase the bondability of the base or the like and the fluororesin. In the present invention, the term "bonding" to metal includes the meaning of affinity for a metal interface. Similarly, the term "non-bonding" to metal includes the meaning of non-affinity for a metal interface.

Meanwhile, it is reported in Patent Document 1 that in a case where a bonding amorphous fluororesin with reactive functional groups including a terminal functional group bondable to metal is used for covering pad electrodes of an ultraviolet light-emitting element in a nitride semiconductor, when the ultraviolet light-emitting element emits ultraviolet light by applying a forward voltage between metal electrode wires connected to a p-electrode and an n-electrode of the ultraviolet light-emitting element, respectively, electrical characteristics of the ultraviolet light-emitting element are degraded. Specifically, it is confirmed that a resistive leakage current path is formed between the p-electrode and the n-electrode of the ultraviolet light-emitting element. According to Patent Document 1, it is assumed that if the amorphous fluororesin is a bonding amorphous fluororesin, when high energy ultraviolet light is irradiated to the bonding amorphous fluororesin, the reactive terminal functional groups are separated from the bonding amorphous fluororesin to form radicals by a photochemical reaction, the radicals are coordinately bonded to metal atoms constituting the pad electrodes, and the metal atoms are separated from the pad electrodes. In addition, it is considered that an electric field is applied between the pad electrodes during light emission and the metal atoms migrate, so that the resistive leakage current path is formed and a short-circuit is generated between the p-electrode and the n-electrode of the ultraviolet light-emitting element.

The present invention has been achieved in view of the above problems, and an object of the invention is to prevent degradation of electrical characteristics caused by a sealing resin filled between electrodes in an ultraviolet light-emitting operation and to provide an ultraviolet light-emitting device with high quality and high reliability.

Means for Solving the Problem

In order to achieve the above object, the present invention provides, as a first aspect, a nitride semiconductor wafer that is formed by arranging a plurality of element units on a substrate in a matrix. Each of the element units is a nitride semiconductor ultraviolet light-emitting element that includes a semiconductor laminated portion constituted by laminating a first semiconductor layer including an n-type AlGaN based semiconductor layer, an active layer including an AlGaN based semiconductor layer, and a second semiconductor layer including a p-type AlGaN based semiconductor layer, an n-electrode constituted by one or more metal layers, a p-electrode constituted by one or more metal layers, a protective insulating film, a first plated electrode that contacts an exposed surface of the p-electrode that is not covered by the protective insulating film, a second plated electrode that contacts an exposed surface of the n-electrode that is not covered by the protective insulating film, and a fluororesin film. In each of the element units, when it is assumed that a region occupied by one element unit in a plane parallel to a surface of the semiconductor laminated portion is an element region, the semiconductor laminated portion is formed so as to laminate the active layer and the second semiconductor layer on the first semiconductor layer in a first region that is a part of the element region and to expose the first semiconductor layer in a second region other than the first region in the element region. The n-electrode is formed on an exposed surface of the first semiconductor layer in the second region. The p-electrode is formed on a uppermost surface of the second semiconductor layer. The protective insulating film is formed to cover at least an entire outer circumferential side surface of the semiconductor laminated portion in the first region, an upper surface of the first semiconductor layer between the first region and the n-electrode, and upper and side surfaces of the n-electrode including at least a portion of an outer circumferential edge part of the n-electrode opposing the first region and not to cover but to expose at least a part of a surface of the n-electrode and at least a part of a surface of the p-electrode. Each of the first plated electrode and the second plated electrode is constituted by a main body electrode composed of copper or an alloy containing copper as a main component and a single-layer or multi-layer surface metal film in which an outermost layer covering an upper surface and a side wall surface of the main body electrode is composed of gold or a platinum group metal. The first plated electrode is formed to be spaced apart from the second plated electrode and to cover an entire upper surface of the first region including an exposed surface of the p-electrode, an entire outer circumferential side surface of the first region covered by the protective insulating film, and a boundary region that is a part of the second region and contacts the first region. The fluororesin film continuously covers at least a part of a side wall surface of the first plated electrode other than an upper end part, a part of a side wall surface of the second plated electrode other than an upper end part, and a part of an exposed surface of the protective insulating film exposed on a gap part between the first plated electrode and the second plated electrode other than an outer circumferential end.

In the present invention, an AlGaN based semiconductor is a group-III nitride semiconductor that is based on a ternary (or binary) compound expressed in the general formula of $Al_xGa_{1-x}N$ (x represents an AlN molar fraction, $0 \leq x \leq 1$) and has a band gap energy equal to or larger than a band gap energy of GaN (x=0) (approximately 3.4 eV). If conditions about the band gap energy are satisfied, the semiconductor might contain a small amount of In, P, As, or the like.

In the element structure of the nitride semiconductor wafer described above, as the n-electrode is disposed to be adjacent to the first region, it is possible to reduce the parasitic resistance on a current path from the n-electrode to the active layer, thus improving light emission characteristics such as external quantum efficiency. However, if the first and second plated electrodes are not provided and the n-electrode and the p-electrode are directly used for flip-chip mounting in the element structure, the n-electrode is adjacent to the p-electrode and thus electric field intensity applied between the n-electrode and the p-electrode in a light-emitting operation is increased. In addition, if a fluororesin, which is a sealing resin, is filled in the space between the n-electrode and the p-electrode, migration of metal atoms composing the electrodes is induced, which leads to a short-circuit between the electrodes with high possibility.

In the element structure of the nitride semiconductor wafer described above, the first plated electrode connected to the p-electrode and the second plated electrode connected to the n-electrode are provided and these first and second plated electrodes are used for flip-chip mounting. The fluororesin is filled not between the n-electrode and the p-electrode but between the first and second plated electrodes. Consequently, the electric field that induces the migration of metal atoms is not an electric field applied between the n-electrode and the p-electrode but an electric field applied between the first and second plated electrodes. Meanwhile, even if the n-electrode is disposed to be adjacent to the first region for the purpose of improving the light emission characteristics, the second plated electrode can be flexibly disposed unlike the n-electrode, and thus the spaced distance between the first and second plated electrodes can be made larger than the spaced distance between the n-electrode and the p-electrode. As a result, it is possible to significantly reduce the possibility of the short-circuit between the electrodes.

In addition, outermost surfaces of the first and second plated electrodes are covered by gold or a platinum group metal that has a high melting point and small ionization tendency, and is hardly migrated, and thus it is possible to surely reduce the possibility of the short-circuit between the electrodes.

However, an actual light-emitting operation is performed in a state where a light-emitting element is flip-chip mounted on a base such as a submount. A solder material is thus interposed between upper surfaces of the first and second plated electrodes and electrode pads on the base. If the solder material contains a metal that easily migrates as compared to gold or a platinum group metal, such as tin, a short-circuit possibly occurs between the electrodes, and thus it is necessary to prevent the migration of metal atoms in the solder material.

In the element structure of the nitride semiconductor wafer described above, the fluororesin film continuously covers at least a part of a side wall surface of the first plated electrode other than an upper end part, a part of a side wall surface of the second plated electrode other than an upper end part, and a part of an exposed surface of the protective insulating film exposed on a gap part between the first plated electrode and the second plated electrode other than an outer circumferential end, and functions as a solder resist. The solder material stays between the upper surfaces of the first and second plated electrodes and the electrode pads on the base and is prevented from entering the gap part between the first and second plated electrodes. In addition, the fluororesin film has high ultraviolet resistance and thus is hardly degraded even if ultraviolet light enters the gap part. Consequently, it is possible to keep high reliability of the light-emitting element as compared to a case of using a resin other than the fluororesin as a solder resist.

When the solder material is present on the upper surfaces of the first and second plated electrodes, the migration path of metal atoms in the solder material on the side of the light-emitting element is obtained by connecting the side wall surfaces of the first and second plated electrodes through the exposed surface of the protective insulating film exposed on the gap part. However, in the path along the side wall surface of each plated electrode, the potential on the side wall surface is uniform and thus an electric field is not generated. As the path along the side wall surface is longer, the migration of metal atoms in the path along the side wall surface is hardly generated.

Consequently, as the first and second plated electrodes and the fluororesin film are provided in the element structure of the nitride semiconductor wafer described above, it is possible to prevent the migration of metal atoms in the solder material on the side of the light-emitting element and to significantly reduce the possibility of the short-circuit between the electrodes caused by the solder material.

In addition, in the element structure of the nitride semiconductor wafer described above, the entire outer circumferential side surface of the semiconductor laminated portion in the first region is covered by the first plated electrode. Ultraviolet light emitted from the active layer within the semiconductor laminated portion does not directly reach the fluororesin, which is a sealing resin, filled in the gap part between the first and second plated electrodes from the outer circumferential side surface of the semiconductor laminated portion in the first region. Consequently, it is possible to significantly reduce the exposure of the fluororesin with ultraviolet light, thus preventing the migration of metal atoms in the plated electrodes and the solder material.

According to a second aspect of the present invention, in the nitride semiconductor wafer of the first aspect, the fluororesin film is not formed in a chip cutting region between the element regions where the plurality of element units are adjacent to each other. When the nitride semiconductor wafer is divided into each of the element units to produce a nitride semiconductor ultraviolet light-emitting element in a chip state, the second aspect enables a dividing process to become easy, and prevents an end part of the fluororesin film from being damaged and the formed fluororesin film from being peeled off in the dividing process.

According to a third aspect of the present invention, in the nitride semiconductor wafer of any of the aspects, the fluororesin film is not formed on an upper surface of the first plated electrode and an upper surface of the second plated electrode. When the nitride semiconductor wafer is divided into each of the element units to produce a nitride semiconductor ultraviolet light-emitting element in a chip state and the nitride semiconductor ultraviolet light-emitting element in a chip state is flip-chip mounted on a base such as a submount, the third aspect enables the upper surfaces of the first and second plated electrodes to be soldered to electrode pads on the base.

Immediately before dividing the nitride semiconductor wafer, it is necessary that the fluororesin film is not formed on the upper surfaces of the first and second plated electrodes. However, even if the fluororesin film is formed on the upper surfaces of the first and second plated electrodes in the nitride semiconductor wafer, which is an intermediate product, it is only required that the fluororesin film is removed immediately before the nitride semiconductor wafer is divided. Although it takes time and effort to remove the fluororesin film, it does not cause any problems in flip-chip mounting.

In addition, in the nitride semiconductor wafer of any one of the aspects, surfaces of the first plated electrode and the second plated electrode are preferably planarized and heights of the surfaces in a direction vertical to a surface of the semiconductor laminated portion are preferably aligned with each other.

Moreover, according to a fourth aspect of the present invention, in the nitride semiconductor wafer of any one of the aspects, an entire outer circumference of the first plated electrode is disposed on the n-electrode with the protective insulating film interposed therebetween. According to the fourth aspect, in addition that the entire outer circumferential side surface of the semiconductor laminated portion in the first region is covered by the first plated electrode, the n-electrode is interposed between the gap part between the first and second plated electrodes and the first semiconductor layer in the second region. It is thus possible to prevent a part of ultraviolet light emitted from the active layer within the semiconductor laminated portion from being reflected by an interface between the substrate and the first semiconductor layer, the rear surface of the substrate, or the like, transmitting through the first semiconductor layer in the second region, and reaching the sealing resin filled in the gap part between the first and second plated electrodes. Consequently, it is possible to significantly reduce the exposure of the fluororesin, which is a sealing resin, filled in the gap part between the first and second plated electrodes with ultraviolet light, thus preventing the migration of metal atoms in the plated electrodes and the solder material.

In addition, in the nitride semiconductor wafer of any one of the aspects, a spaced distance between the first plated electrode and the second plated electrode is preferably equal to or larger than 75 µm. Such a preferable aspect enables the first plated electrode and the second plated electrode to be formed with high yield without any contact therebetween.

Moreover, in the nitride semiconductor wafer of any one of the aspects, the fluororesin film preferably includes an amorphous fluororesin composed of a polymer or a copolymer having a fluorine-containing aliphatic cyclic structure as a structural unit. With such a preferable aspect, it is possible to prevent the migration of metal atoms in the plated electrodes and the solder material.

In addition, in the nitride semiconductor wafer of any of the aspects, the fluororesin film preferably includes a first type fluororesin where a terminal functional group of a polymer or a copolymer composing a fluororesin is a non-reactive terminal functional group that is not bondable to metal.

In addition, in the nitride semiconductor wafer of any of the aspects, the fluororesin film is preferably constituted by a laminated film of two or more layers, a resin film of a first layer of the laminated film that contacts the first plated electrode and the second plated electrode preferably includes a second type fluororesin where a terminal functional group of a polymer or a copolymer composing a fluororesin is a reactive terminal functional group bondable to metal, and a resin film of each of second and subsequent layers of the laminated film preferably includes a first type fluororesin where a terminal functional group of a polymer or a copolymer composing a fluororesin is a non-reactive terminal functional group that is not bondable to metal. With such a preferable aspect, it is possible to reduce an influence of the reactive terminal functional group upon the migration of metal atoms, and at the same time, it is possible to increase bonding between the fluororesin film and the side wall surfaces of the first and second plated electrodes, and the fluororesin film is hardly peeled off.

In addition, in the nitride semiconductor wafer of any of the aspects, a second fluororesin film that includes a second type fluororesin where a terminal functional group of a polymer or a copolymer composing a fluororesin is a reactive terminal functional group bondable to metal is preferably formed as a primer film of the fluororesin film on a chip cutting region between the element regions where the plurality of element units are adjacent to each other and a side region of the chip cutting region or on the side region of the chip cutting region. With such a preferable aspect, when the nitride semiconductor wafer is divided into each of the element units to produce a nitride semiconductor ultraviolet light-emitting element in a chip state, the primer film functions as a binder between the fluororesin film and the chip. It is thus possible to prevent an end part of the fluororesin film from being damaged and to prevent the formed fluororesin film from being peeled off.

Moreover, the nitride semiconductor wafer of any of the aspects preferably comprises an inorganic material film that does not transmit ultraviolet light between the protective insulating film on a bottom surface of the gap part between the first plated electrode and the second plated electrode and the fluororesin film. As described above, in addition that the entire outer circumferential side surface of the semiconductor laminated portion in the first region is covered by the first plated electrode, the inorganic material film that does not transmit ultraviolet light is interposed between the gap part between the first and second plated electrodes and the first semiconductor layer in the second region. It is thus possible to prevent a part of ultraviolet light emitted from the active layer within the semiconductor laminated portion from being reflected by an interface between the substrate and the first semiconductor layer, the rear surface of the substrate, or the like, transmitting through the first semiconductor layer in the second region, and reaching the fluororesin, which is a sealing resin, filled in the gap part between the first and second plated electrodes. Consequently, it is possible to significantly reduce the exposure of the fluororesin, which is a sealing resin, filled in the gap part between the first and second plated electrodes with ultraviolet light, thus preventing the migration of metal atoms in the plated electrodes and the solder material.

In order to achieve the above object, the present invention provides, as a first aspect, a manufacturing method of the nitride semiconductor wafer of the above aspects. The manufacturing method comprises after forming the semiconductor laminated portion, the n-electrode, the p-electrode, the protective insulating film, the first plated electrode, and the second plated electrode on the substrate, forming a first mask material that blocks formation of the fluororesin film on a chip cutting region between the element regions where the plurality of element units are adjacent to each other or the chip cutting region and a side region of the chip cutting region, after forming the first mask material, injecting the fluororesin in the element region surrounded by the first mask material to form the fluororesin film, and after forming the fluororesin film, removing the first mask material.

With the manufacturing method of a nitride semiconductor wafer of the first aspect, the nitride semiconductor wafer of the first and second aspects is produced.

According to a second aspect of the present invention, the manufacturing method of a nitride semiconductor wafer of the first aspect further comprises forming a second mask material that blocks formation of the fluororesin film on upper surfaces of the first plated electrode and the second plated electrode of the element units after forming the first mask material, injecting the fluororesin in the element region surrounded by the first mask material after forming the first and second mask materials, and removing the first and second mask materials simultaneously or separately after forming the fluororesin film.

In addition, in the manufacturing method of a nitride semiconductor wafer of the second aspect, the second mask material is preferably composed of a resin composition that does not contain a fluororesin, and in dissolving the second mask material by an organic solvent and removing the second mask material, if the fluororesin film is formed on the second mask material, the fluororesin film on the second mask material is preferably simultaneously removed.

According to a third aspect of the present invention, the manufacturing method of a nitride semiconductor wafer of the first aspect further comprises polishing the fluororesin film formed on upper surfaces of the first plated electrode and the second plated electrode and removing the fluororesin film.

With the manufacturing method of a nitride semiconductor wafer of the second or third aspect, the nitride semiconductor wafer of the first to third aspects is produced.

Moreover, the manufacturing method of a nitride semiconductor wafer of any of the aspects preferably further comprises using a substrate that transmits ultraviolet light as the substrate, forming the first plated electrode so as to dispose an entire outer circumference of the first plated electrode on the n-electrode with the protective insulating film interposed therebetween, using a negative photoresist material as the first mask material, forming the photoresist material on an entire surface of the substrate, then irradiating ultraviolet light from a rear surface of the substrate to expose the photoresist material, and removing a part of the photoresist material where exposure with the ultraviolet light is blocked by the first plated electrode and the n-electrode by a development process.

Such a preferable aspect enables the substantially entire element region to be covered by the n-electrode and the first plated electrode. Moreover, the electrodes function as a mask for exposure and the chip cutting region or the chip cutting region and the side region of the chip cutting region can be exposed with light from the rear surface of the wafer in a self-aligned manner. Consequently, it is possible to easily achieve the manufacturing method of a nitride semiconductor wafer of the first aspect.

In addition, the manufacturing method of a nitride semiconductor wafer of any of the aspects preferably further comprises applying the first mask material on the chip cutting region by an ink-jet system. With such a preferable aspect, it is possible to easily achieve the manufacturing method of a nitride semiconductor wafer of the first aspect.

The manufacturing method of a nitride semiconductor wafer according to any of the aspects preferably further comprises forming a second fluororesin film that includes a second type fluororesin where a terminal functional group of a polymer or a copolymer composing a fluororesin is a reactive terminal functional group bondable to metal as a primer film of the fluororesin film on a chip cutting region between the element regions where the plurality of element units are adjacent to each other and a side region of the chip cutting region or on the side region of the chip cutting region, instead of or in addition to forming the first mask material, before applying a coating liquid containing a fluororesin composing the fluororesin film. With such a preferable aspect, when the nitride semiconductor wafer is divided into each of the element units to produce the nitride semiconductor ultraviolet light-emitting element in a chip state, it is possible to provide the nitride semiconductor wafer that can prevent an end part of the fluororesin film from being damaged and the formed fluororesin film from being peeled off.

In order to achieve the above object, the present invention provides a nitride semiconductor ultraviolet light-emitting element formed by dividing the nitride semiconductor wafer of any of the aspects into each of the element units.

Moreover, in order to achieve the above object, the present invention provides a nitride semiconductor ultraviolet light-emitting device that is formed by flip-chip mounting at least one nitride semiconductor ultraviolet light-emitting element of the above aspects on a base for flip-chip mounting. In the nitride semiconductor ultraviolet light-emitting device, the base is constituted by an insulating base material and two or more metal films electrically separated from each other. The two or more metal films are formed on a surface of the insulating base material with an upper surface and a side wall surface covered by gold or a platinum group metal. The two or more metal films are formed in a predetermined planar view shape that is capable of mounting at least one nitride semiconductor light-emitting element thereon and includes two or more electrode pads as a whole. Along a boundary line between an exposed surface of the insulating base material that is not covered by the two or more metal films and a side wall surface of the metal film, at least a part of the exposed surface of the insulating base material that is continuous with the boundary line and a part of the side wall surface of the metal film that is continuous with the boundary line are covered by a fluororesin. At least parts of an upper surface of the metal film composing the two or more electrode pads are not covered by the fluororesin.

Effect of the Invention

In the nitride semiconductor wafer of the above aspects, it is possible to achieve an ultraviolet light-emitting device that prevents degradation of electrical characteristics caused by a sealing resin filled between an electrodes in an ultraviolet light-emitting operation and that has high quality and high reliability by mounting the nitride semiconductor ultraviolet light-emitting element obtained by dividing the nitride semiconductor wafer into each of element units on a base.

In the nitride semiconductor wafer of the above aspects, means for preventing the degradation of electrical characteristics are implemented at a stage of manufacturing a wafer. Consequently, it is not necessary to implement the means for preventing the degradation of electrical characteristics at a stage of mounting the nitride semiconductor ultraviolet light-emitting element on a base and a normal mounting process is employed.

BRIEF DESCRIPTION OF THE DRAWINGS

FIG. 7 is a plan view schematically showing the planar structure and an example of a planar view pattern of a first region and a second region of the nitride semiconductor ultraviolet light-emitting element in first to sixth embodiments of the nitride semiconductor wafer according to the present invention, before a p-electrode, an n-electrode, and the first and second plated electrodes are formed.

FIG. 8 is a plan view schematically showing the planar structure and an example of a planar view pattern of the p-electrode and the n-electrode of the nitride semiconductor ultraviolet light-emitting element in the first to sixth embodiments of the nitride semiconductor wafer according to the present invention, before the first and second plated electrodes are formed.

FIG. 18 is a cross-sectional view schematically showing a configuration example of a nitride semiconductor ultraviolet light-emitting device according to the present invention.

DESCRIPTION OF EMBODIMENT

Figure 1:
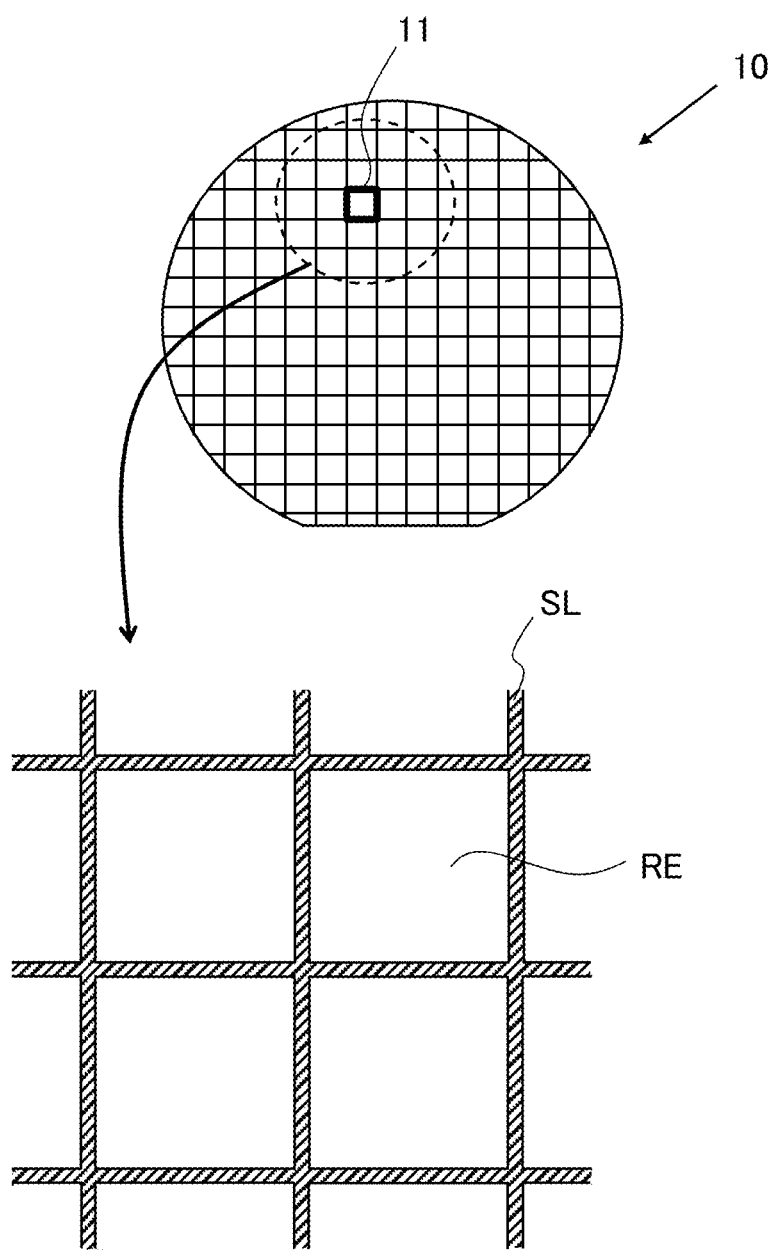
FIG. 1 is a plan view schematically showing an example of the arrangement structure of nitride semiconductor ultraviolet light-emitting elements in an embodiment of a nitride semiconductor wafer according to the present invention.

A nitride semiconductor wafer, a manufacturing method thereof, a nitride semiconductor ultraviolet light-emitting element, and a nitride semiconductor ultraviolet light-emitting device according to the present invention are described with reference to the drawings. For easy understanding of the description, an essential part is emphasized to schematically illustrate invention contents in the drawings used in the following description, so that a dimensional ratio of each component does not correspond to a dimensional ratio of an actual element and a component actually to be used. Hereinafter, the description will be given supposing a case where the present light-emitting element is a light-emitting diode. In addition, for the sake of convenience, the nitride semiconductor wafer according to the present invention is referred to as "present wafer", the manufacturing method thereof according to the present invention is referred to as "present manufacturing method", the nitride semiconductor ultraviolet light-emitting element according to the present invention obtained by dividing the present wafer is referred to as "present light-emitting element", and the nitride semiconductor ultraviolet light-emitting device according to the present invention obtained by flip-chip mounting the present light-emitting element on a predetermined base is referred to as "present light-emitting device".

First Embodiment

As shown in FIG. 1, the present wafer 10 is a nitride semiconductor wafer formed by arranging a plurality of the present light-emitting elements 1 with the same element structure on a substrate 12 in a matrix. For the sake of convenience, the region occupied by one present light-emitting element 11 as an element unit in a plane parallel to a surface of the substrate 12 is defined hereinafter as an element region RE. As described later, the element region RE is constituted by a first region R1 and a second region R2. A scribe region SL (corresponding to "chip cutting region"), which is a margin for cutting the present wafer 10 to divide a plurality of the present light-emitting elements 11 on the present wafer 10 into chips, is present between adjacent element regions RE. The scribe regions SL are extended vertically and horizontally on a surface of the wafer in a lattice. The surface of the present wafer 10 is thus constituted by the element regions RE and the scribe regions SL.

Next, the element structure of the present light-emitting element 11 in a wafer state is described. The present light-emitting element 11 is configured to include a semiconductor laminated portion 21, a p-electrode 22, an n-electrode 23, a protective insulating film 24, a first plated electrode 25, a second plated electrode 26, and a fluororesin film 27.

Figure 2:
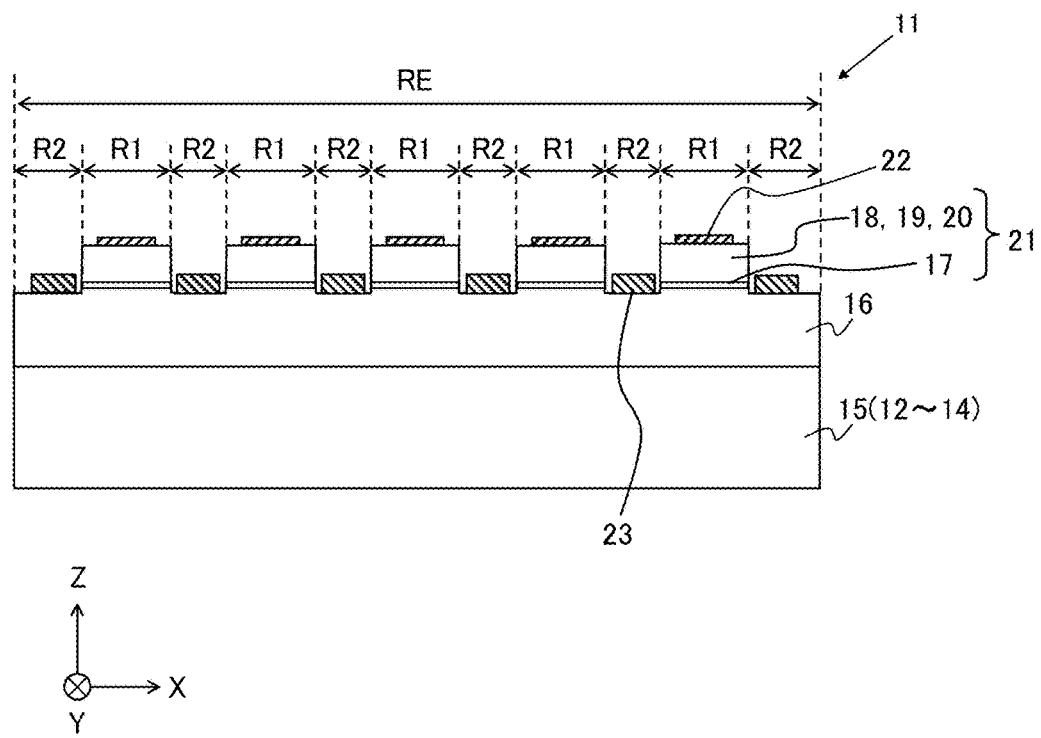
FIG. 2 is a cross-sectional view taken along a cross-section A-A', schematically showing an example of the element structure of the nitride semiconductor ultraviolet light-emitting element in first to fifth embodiments of the nitride semiconductor wafer according to the present invention, before a protective insulating film and first and second plated electrodes are formed.
Figure 3:
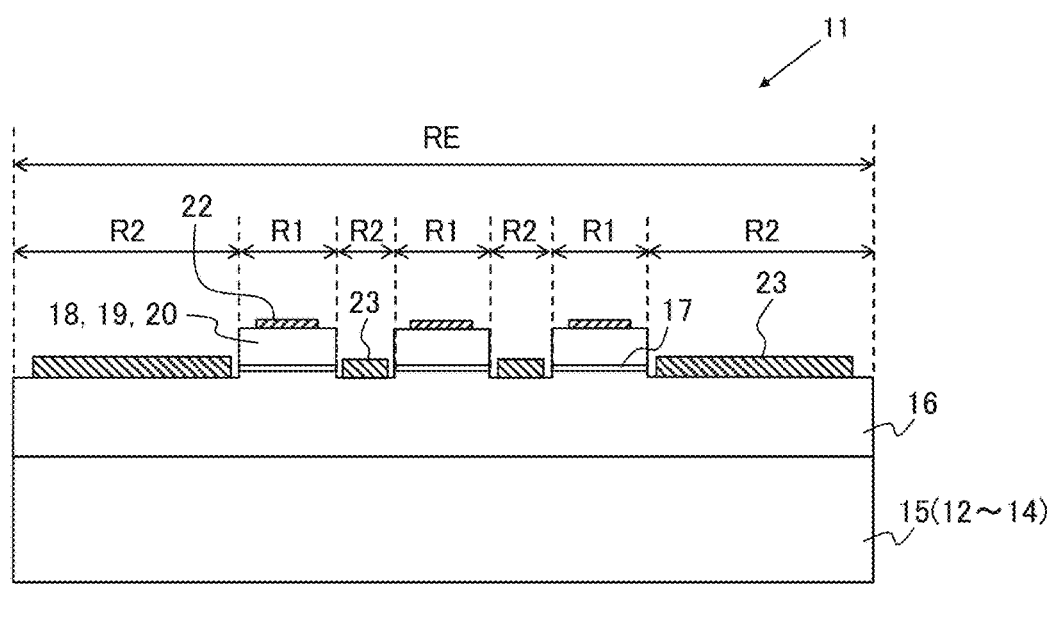
FIG. 3 is a cross-sectional view taken along a cross-section B-B', schematically showing an example of the element structure of the nitride semiconductor ultraviolet light-emitting element in the first to fifth embodiments of the nitride semiconductor wafer according to the present invention, before the protective insulating film and the first and second plated electrodes are formed.
Figure 4:
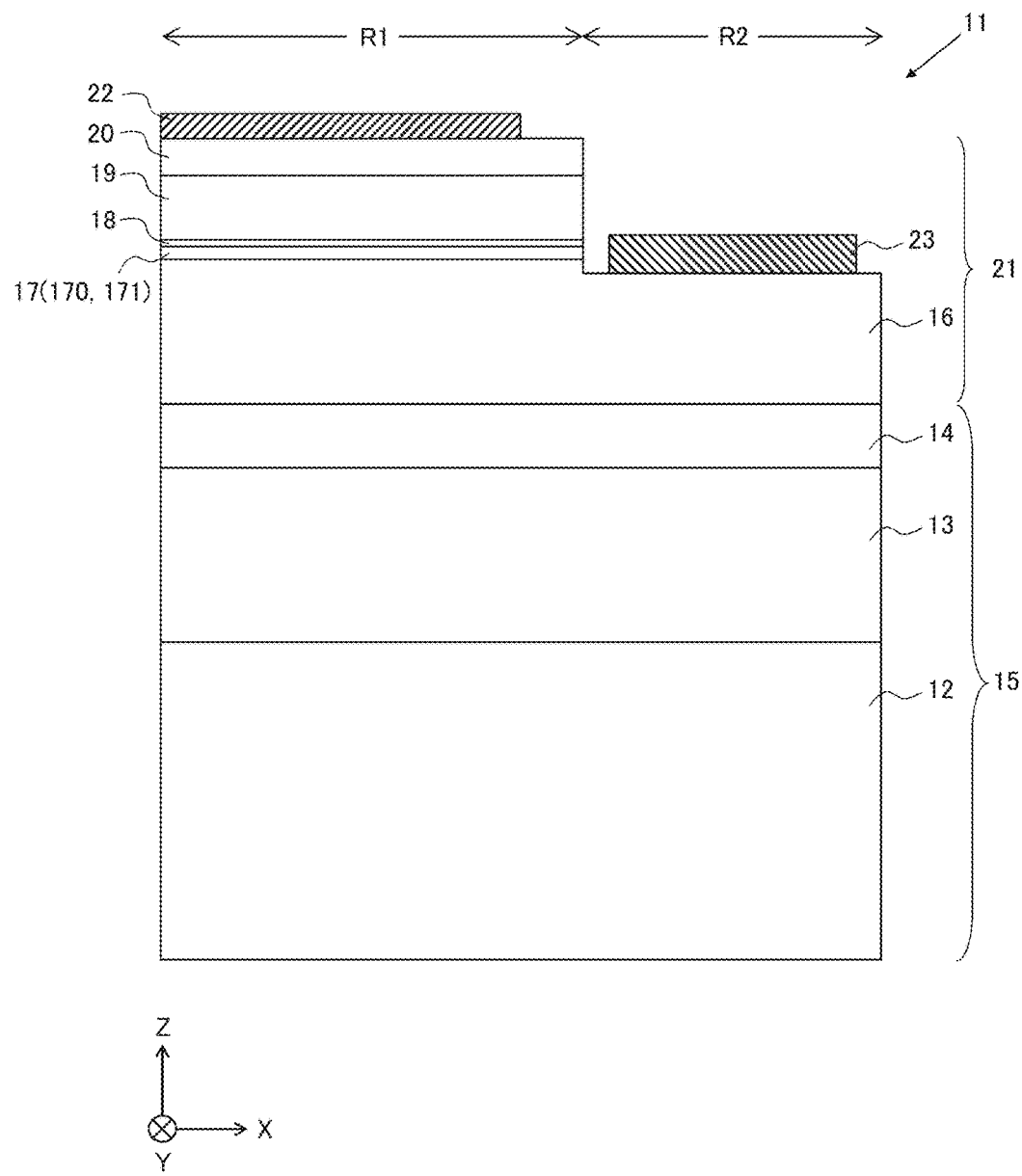
FIG. 4 is a main part cross-sectional view schematically showing the main part of the element structure shown in FIGS. 2 and 3.

More specifically, as shown in FIGS. 2 to 4, the present light-emitting element 11 uses a substrate obtained by growing an AlN layer 13 and an AlGaN layer 14 on the sapphire (0001) substrate 12 as a template 15, and has the semiconductor laminated portion 21 on the template 15, where an n-type cladding layer 16 composed of n-type AlGaN, an active layer 17, a p-type AlGaN electron blocking layer 18 having a higher AlN molar fraction than the active layer 17, a p-type AlGaN cladding layer 19, and a p-type GaN contact layer 20 are laminated in order. The n-type cladding layer 16 corresponds to "first semiconductor layer", and the electron blocking layer 18, the p-type cladding layer 19, and the p-type contact layer 20 correspond to "second semiconductor layer". Parts of planar view regions (the second region R2) of the active layer 17, the electron blocking layer 18, the p-type cladding layer 19, and the p-type contact layer 20 above the n-type cladding layer 16 are removed by reactive ion etching or the like until a part of a surface of the n-type cladding layer 16 is exposed. The laminated structure from the active layer 17 to the p-type contact layer 20 is formed on the n-type cladding layer 16 in the first region R1. As an example, the active layer 17 has a single layer quantum well structure constituted by an n-type AlGaN barrier layer 170 having a film thickness of 10 nm and an AlGaN or GaN well layer 171 having a film thickness of 3.5 nm. The active layer 17 may have a double heterojunction structure in which the active layer 17 is interposed between n-type and p-type AlGaN layers having high AlN molar fractions at a lower layer and an upper layer, or may have a multiple quantum well structure in which the single layer quantum well structure is multilayered.

Each AlGaN layer is formed by a well-known epitaxial growth method such as a metal-organic vapor phase epitaxy (MOVPE) method or a molecular beam epitaxy (MBE) method, and, for example, Si is used as a donor impurity of an n-type layer and Mg is used as an acceptor impurity of a p-type layer. An AlN layer and an AlGaN layer which do not specify a conductivity type are undoped layers in which an impurity is not implanted. Regarding the film thicknesses of AlGaN layers other than the active layer 17, for example, the n-type cladding layer 16 has a film thickness of 2000 nm, the electron blocking layer 18 has a film thickness of 2 nm, the p-type cladding layer 19 has a film thickness of 540 nm, and the p-type contact layer 20 has a film thickness of 200 nm. The film thicknesses of the AlGaN layers are not limited to the values exemplified above.

The p-electrode 22 composed of, for example, Ni/Au is formed on a surface of the p-type contact layer 20, and the n-electrode 23 composed of, for example, Ti/Al/Ti/Au is formed on the surface of the n-type cladding layer 16 in the second region R2. The number, material, and film thickness of metal layers constituting the p-electrode 22 and the n-electrode 23 are not limited to the number and material exemplified above and a film thickness to be exemplified later.

For the sake of convenience, it is assumed that an orthogonal coordinate system XYZ is prepared, a plane parallel to the surface of the substrate 12 is defined as an XY plane, a thickness direction of the substrate 12 is defined as a Z direction, and the XY coordinate of the center of the element region RE of the present light-emitting element 11 is (0, 0). In this case, FIG. 2 is a cross-sectional view of the present light-emitting element 11, which is parallel to an XZ plane taken along a line A-A' in a plan view of FIG. 9 to be described later, and FIG. 3 is a cross-sectional view of the present light-emitting element 11, which is parallel to an XZ plane taken along a line B-B' in the plan view of FIG. 9. FIGS. 2 and 3 show a state where the semiconductor laminated portion 21 is formed above the template 15 and then the p-electrode 22 and the n-electrode 23 are formed. In addition, FIGS. 2 and 3 schematically show the element structure before the protective insulating film 24, the first plated electrode 25, the second plated electrode 26, and the fluororesin film 27, which are described later, are formed. For convenience of the description, the element structure of the present light-emitting element 11 before the protective insulating film 24, the first and second plated electrodes 25 and 26, and the fluororesin film 27 are formed is hereinafter referred to as "before-plating element structure". The element structure of the present light-emitting element 11 after the protective insulating film 24, the first and second plated electrodes 25 and 26, and the fluororesin film 27 are formed is hereinafter referred to as "after-plating element structure". FIG. 4 schematically shows a main part cross-sectional view of the before-plating element structure of the present light-emitting element 11 shown in FIGS. 2 and 3.

As shown in FIGS. 2 to 4, the semiconductor laminated portion 21 in the first region R1 has a multilayer structure from the n-type cladding layer 16 to the p-type contact layer 20, and projects from an exposed surface of the n-type cladding layer 16 in the second region R2 in a Z direction. For the sake of convenience, the semiconductor laminated portion 21 in the first region R1 is hereinafter referred to as "mesa". The outermost surface of the mesa is an upper surface of the p-type contact layer 20. The Z-direction difference between the outermost surface of the mesa (the first region R1) and the exposed surface of the n-type cladding layer 16 (the second region R2) (the step of the mesa) is calculated by adding the total film thickness from the active layer 17 to the p-type contact layer 20 to the depth of the surface of the n-type cladding layer 16 removed in a −Z direction by the etching, and is approximately 800 nm. Assuming that dimensions (the chip size) of the element region RE in the X and Y directions are approximately 0.8 to 1.5 mm, the step is very small, which is 0.1% of the chip size or less. These dimensions are largely different from the schematically illustrated dimension ratio in the drawings.

Figure 5:
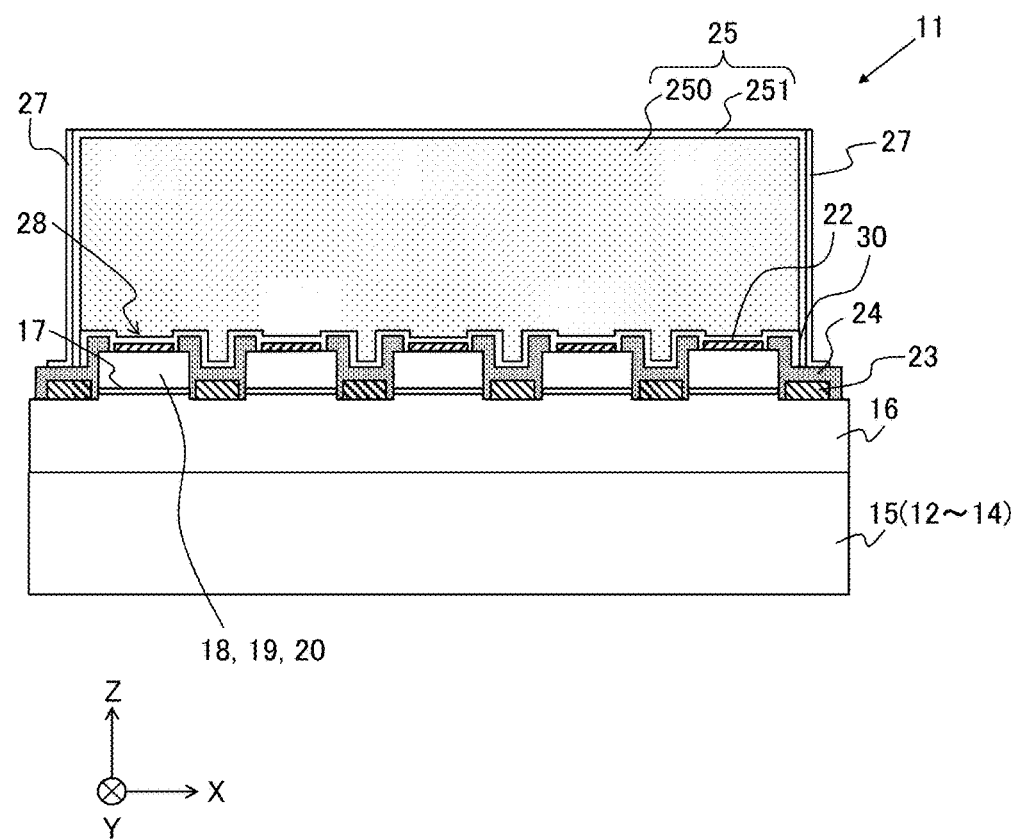
FIG. 5 is a cross-sectional view taken along the cross-section A-A', schematically showing an example of the element structure of the nitride semiconductor ultraviolet light-emitting element in the first to third and fifth embodiments of the nitride semiconductor wafer according to the present invention, after the protective insulating film, the first and second plated electrodes, and a fluororesin film are formed.
Figure 6:
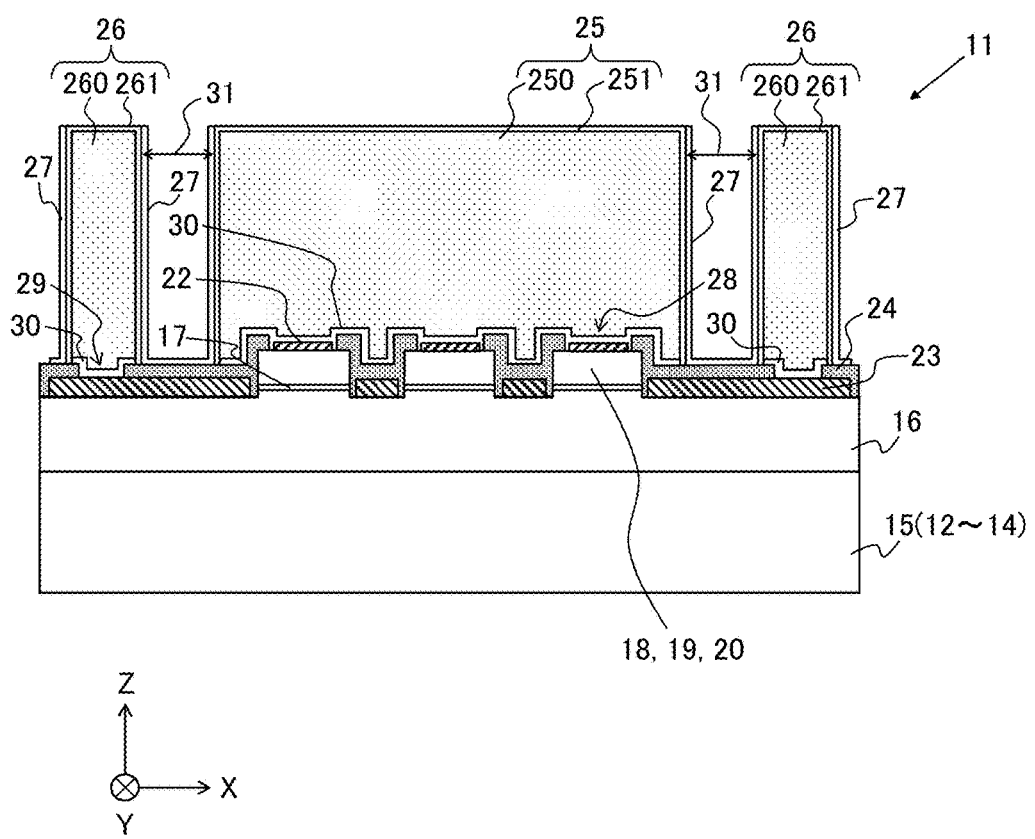
FIG. 6 is a cross-sectional view taken along the cross-section B-B', schematically showing an example of the element structure of the nitride semiconductor ultraviolet light-emitting element in the first to third and fifth embodiments of the nitride semiconductor wafer according to the present invention, after the protective insulating film, the first and second plated electrodes, and the fluororesin film are formed.

FIGS. 5 and 6 schematically show an example of the after-plating element structure of the present light-emitting element 11 in which the protective insulating film 24, the first and second plated electrodes 25 and 26, and the fluororesin film 27 are formed. FIG. 5 is a cross-sectional view parallel to an XZ plane taken along the line A-A' in the plan view of FIG. 9. FIG. 6 is a cross-sectional view of the present light-emitting element 11, which is parallel to an XZ plane taken along the line B-B' in the plan view of FIG. 9.

As shown in FIGS. 5 and 6, the first plated electrode 25 is constituted by a first main body electrode 250 functioning as a main body part and a first surface metal film 251 that covers a surface of the main body part. In addition, the second plated electrode 26 is constituted by a second main body electrode 26 functioning as a main body part and a second surface metal film 261 that covers a surface of the main body part. In FIGS. 2 to 6, hatched portions correspond to the p-electrode 22 and the n-electrode 23. In FIGS. 5 and 6, a dot-patterned portion corresponds to the first and second main body electrodes 250 and 260.

FIG. 7 shows an example of a planar view pattern of the first region R1 and the second region R2 before the p-electrode 22, the n-electrode 23, the first plated electrode 25, and the second plated electrode 26 are formed. In FIG. 7, hatched portion corresponds to the first region R1. In the planar view pattern shown in FIG. 7, the first region R1 has a comb-like shape including four recess parts on the upper side of the drawing (Y>0) and four recess parts on the lower side of the drawing (Y<0). In FIG. 7, a dot pattern is applied on two recessed regions R3 in the second region R2, each of which has three sides surrounded by the recess part, for the purpose of distinguishing the recessed regions R3 from a surrounding region which is the second region other than the recessed regions R3. The second region R2 is constituted by eight recessed regions R3 and a surrounding region R4 that surrounds the recessed regions R3 and the first region R1. In FIG. 7, the boundary between the recessed region R3 and the surrounding region R4 is indicated by a broken line C.

FIG. 8 shows an example of a planar view pattern of the p-electrode 22 and the n-electrode 23 before the first plated electrode 25 and the second plated electrode 26 are formed. In FIG. 8, hatched portions correspond to the p-electrode 22 and the n-electrode 23. In addition, a boundary line BL between the first region R1 and the second region R2 are shown for reference. Comparing FIG. 8 to FIG. 7, it is found that the n-electrode 23 is continuously formed over the recessed region R3 and the surrounding region R4, and is annularly formed to surround the first region R1. Similarly to the first region R1, the p-electrode 22 has a comb-like shape including recess parts on the upper side and the lower side of the drawing. For example, the outer circumferential line of the p-electrode 22 is retracted from the outer circumferential line of the first region R1 (the boundary line between the first region R1 and the second region R2) into the first region R1 by approximately 10 μm. In addition, the inner circumferential line of the n-electrode 23 is retracted from the outer circumferential line of the first region R1 into the side of the second region by approximately 10 μm. The outer circumferential line of the n-electrode 23 is retracted inside from the outer circumferential line of the element region RE and is also retracted inside from the outer circumferential line of the protective insulating film 24 by approximately 10 μm.

Figure 9:
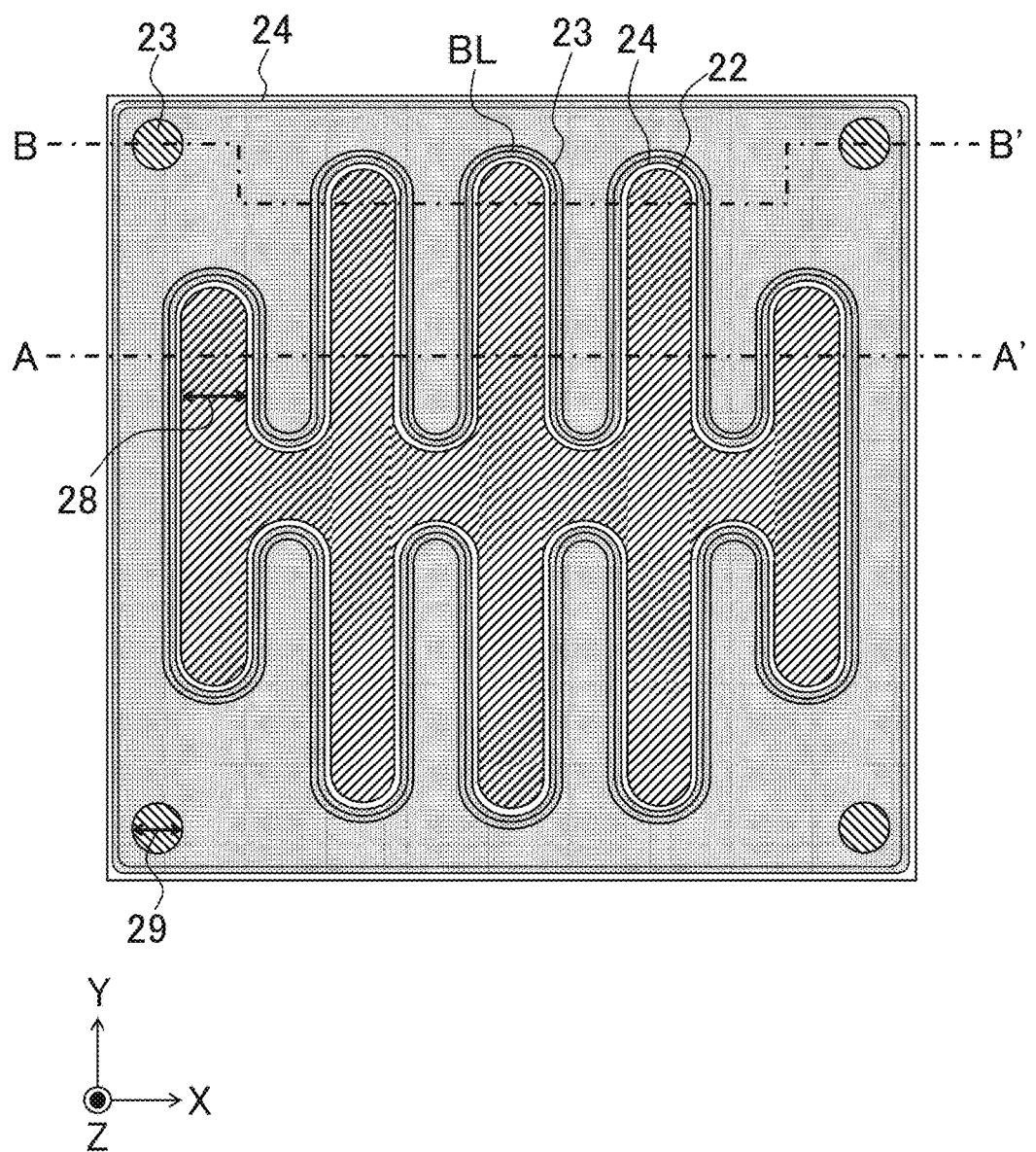
FIG. 9 is a plan view schematically showing the planar structure and an example of a planar view pattern of the protective insulating film of the nitride semiconductor ultraviolet light-emitting element in the first to sixth embodiments of the nitride semiconductor wafer according to the present invention, before the first and second plated electrodes are formed.

FIG. 9 shows an example of a planar view pattern of the protective insulating film 24 before the first plated electrode 25 and the second plated electrode 26 are formed. The protective insulating film 24 is provided on the substantially entire surface of the element region RE, and the outer circumferential line of the protective insulating film 24 may be the same as the outer circumferential line of the element region RE or may be retracted slightly inside from the outer circumferential line of the element region RE by, for example, approximately 10 μm. In addition, the protective insulating film 24 includes a first opening 28 in the first region R1 and a second opening 29 at four corners in the surrounding region R4. The p-electrode 22 is exposed through the first opening 28 and the n-electrode 23 is exposed through the second opening 29 without being covered by the protective insulating film 24. The n-electrode 23 is thus covered by the protective insulating film 24 other than the portion exposed through the second opening 29. The outer circumferential line of the first opening 28 is retracted from the outer circumferential line of the first region R1 into the first region R1 by, for example, approximately 5 to 15 μm. The outer circumferential line of the first opening 28 may be on the same position as the outer circumferential line of the p-electrode 22, or may be outside or inside of the outer circumferential line of the p-electrode 22. In FIG. 9, a dot-patterned portion corresponds to the protective insulating film 24, and hatched portions correspond to the p-electrode 22 exposed through the first opening 28 and the n-electrode 23 exposed through the second opening 29. The boundary line BL between the first region R1 and the second region R2 is also shown for reference.

According to the present embodiment, the protective insulating film 24 is a $SiO_2$ film, an $Al_2O_3$ film, or the like formed by a chemical vapor deposition (CVD) method and is formed to have a film thickness of approximately 100 nm to 1 μm and preferably approximately 150 nm to 350 nm. As shown in FIGS. 5, 6, and 9, the protective insulating film 24 is formed to cover at least the entire outer circumferential side surface of the semiconductor laminated portion 21 in the first region R1 (the side wall surface of the step of the mesa), the exposed surface of the n-type cladding layer 16 between the first region R1 and the n-electrode 23, and the upper and side surfaces of the n-electrode 23 including at least a portion of the outer circumferential edge part of the n-electrode 23 opposing the first region R1. However, the protective insulating film 24 is formed so that at least a part of the surface of the p-electrode 22 is not covered but exposed through the first opening 28. In addition, the protective insulating film 24 is formed so that at least a part of the surface of the n-electrode 23 is not covered but exposed through the second opening 29. The first main body electrode 250 is thus electrically connected via the first opening 28 to the p-electrode 22 with a seed film 30 to be described later being interposed therebetween. In addition, the second main body electrode 260 is electrically connected via the second opening 29 to the n-electrode 23 with the seed film 30 to be described later being interposed therebetween.

The protective insulating film 24 is provided to prevent the first main body electrode 250 from directly contacting the exposed surface of the n-type cladding layer 16 and a side end surface of the p-type cladding layer 19 so as to form a bypass circuit against a current path from the p-type cladding layer 19 through the active layer 17 to the n-type cladding layer 16. Consequently, if the protective insulating film 24 is slightly retracted downward from an upper end of the step part of the mesa, and a part of the upper end of the side wall surface of the step part of the mesa, that is, a side end surface of the p-type contact layer 20 is partially exposed to directly contact the first main body electrode 250, the bypass circuit is not formed and thus this does not affect a light-emitting operation. While the protective insulating film 24 covers the exposed surface of the p-type contact layer 20 that is not covered by the p-electrode 22 in FIGS. 5, 6, and 9, the exposed surface of the p-type contact layer 20 does not need to be covered by the protective insulating film 24. On the other hand, while the protective insulating film 24 does not cover the outer circumferential end part of the p-electrode 22 in FIGS. 5, 6, and 9, the protective insulating film 24 may cover the outer circumferential end part of the p-electrode 22.

Figure 10:
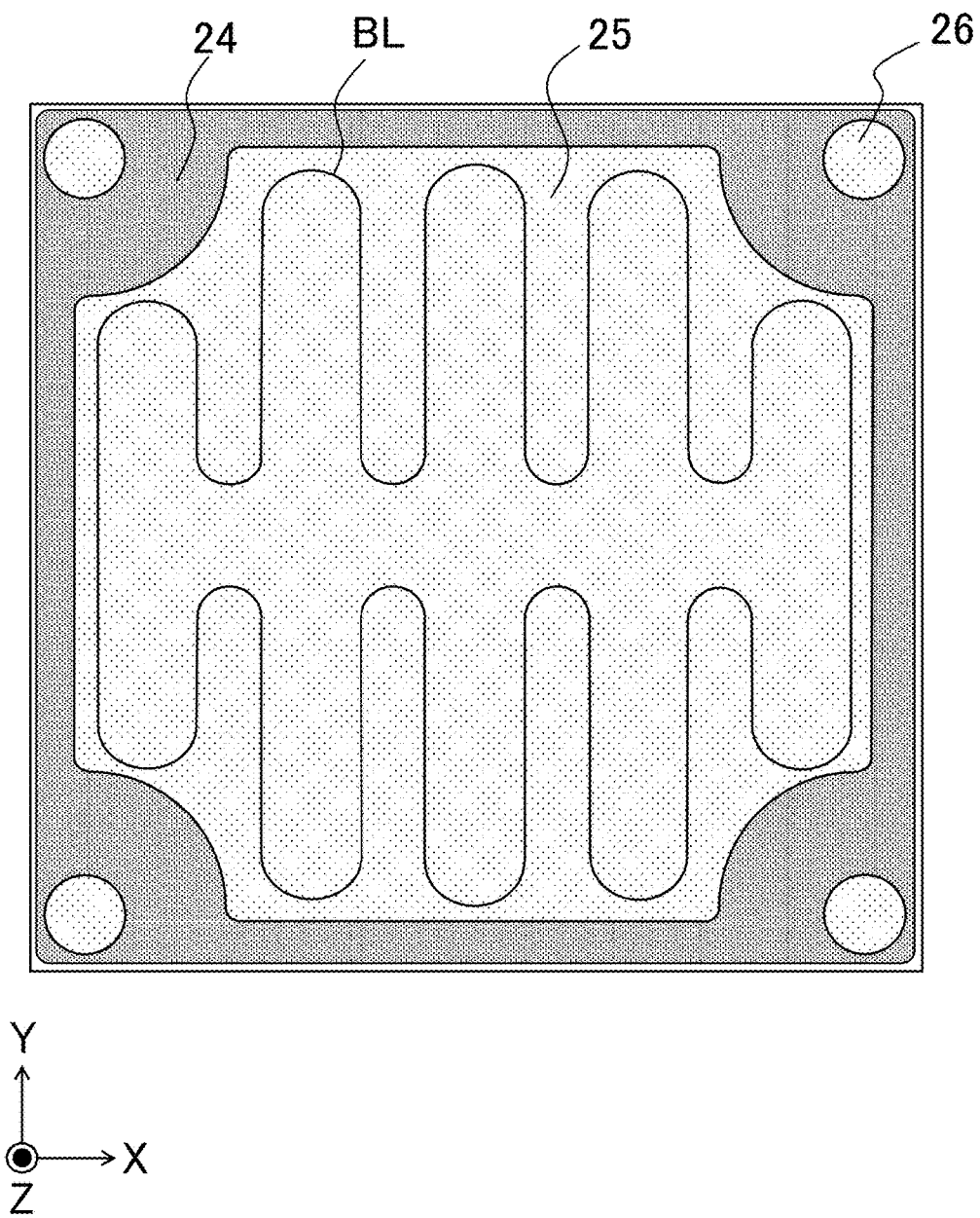
FIG. 10 is a plan view schematically showing an example of a planar view pattern of the first and second plated electrodes of the nitride semiconductor ultraviolet light-emitting element in the first to sixth embodiments of the nitride semiconductor wafer according to the present invention.

FIG. 10 shows an example of a planar view pattern of the first plated electrode 25 and the second plated electrode 26.

In FIG. 10, a dot-patterned portion corresponds to the first plated electrode 25 and the second plated electrodes 26. The boundary line BL between the first region R1 and the second region R2 is also shown for reference. The outer circumferential lines of the first plated electrode 25 and the second plated electrode 26 are on the protective insulating film 24 in the second region R2 and are spaced apart from each other by 75 µm or more at a portion where the outer circumferential lines are adjacent to each other. The spaced distance is preferably equal to or larger than 100 µm and more preferably approximately 100 to 150 µm. While the outer circumferential line of the first plated electrode 25 is preferably located on the n-electrode 23 through the protective insulating film 24, a part of the outer circumferential line of the first plated electrode 25 that is not on the n-electrode 23 may be present depending on the planar view shape of the n-electrode 23. In addition, while the outer circumferential line of the first plated electrode 25 is located within the surrounding region R4 in the second region R2 in FIG. 10, a part of the outer circumferential line of the first plated electrode 25 may be within the recessed region R3 depending on the shape or size of the recessed region R3. The outer circumferential line of the second plated electrode 26 is preferably outside the outer circumferential line of the second opening 29 in the protective insulating film 24 by, for example, approximately 0 to 30 µm. However, the outer circumferential line of the second plated electrode 26 may be partially or entirely provided in alignment with or inside the outer circumferential line of the second opening 29 in the protective insulating film 24. This is because even in this case, the n-electrode 23 that is not covered by the second plated electrode 26 is only exposed through the second opening 29. Consequently, if the distance between the exposed n-electrode 23 and the first plated electrode 25 is secured like the distance between the first plated electrode 25 and the second plated electrode 26 described above, or if the area of the upper surface of the second plated electrode 26 required for soldering to be described later is secured, any problem does not occur. The second region R2 inside of the outer circumferential line of the first plated electrode 25 corresponds to a boundary region that is a part of the second region R2 in the region where the first plated electrode 25 is formed and contacts the first region R1.

As shown in FIGS. 5, 6, and 10, the first plated electrode 25 is formed to cover the entire uppermost surface of the first region R1 including the exposed surface of the p-electrode 22 that is not covered by the protective insulating film 24, the entire outer circumferential side surface of the semiconductor laminated portion 21 in the first region R1 covered by the protective insulating film 24 (the side wall surface of the step part of the mesa), and the boundary region that is a part of the second region R2 and contacts the first region R1 to surround the first region R1. In addition, as shown in FIGS. 5, 6, and 10, the second plated electrode 26 is formed at least on the n-electrode 23 that is exposed through the second opening 29 in the protective insulating film 24 and is also preferably formed on the protective insulating film 24 around the second opening 29. In the example of FIG. 10, the second plated electrode 26 is circular in a planar view. The outer circumferential line of the first plated electrode 25 adjacently opposing the second plated electrode 26 is formed in an arc shape, so that the distance between the first plated electrode 25 and the second plated electrode 26 in the adjacent section is fixed. That is, it is possible to prevent local electric field concentration between the first plated electrode 25 and the second plated electrode 26. From this point of view, the planar view shape of the second plated electrode 26 may be a sector in addition to a circular shape. Additionally, the planar view shape of the second plated electrode 26 may be a rectangular shape in which at least a corner opposing the first plated electrode 25 is formed in an arc.

In the present embodiment, the first and second main body electrodes 250 and 260 are composed of copper and produced by a well-known electrolytic plating method. The first and second main body electrodes 250 and 260 may be composed of alloys containing copper as the main component and metal such as lead (Pb), iron (Fe), zinc (Zn), manganese (Mn), nickel (Ni), cobalt (Co), and beryllium (Be). However, the first and second main body electrodes 250 and 260 are preferably composed of copper because the first and second main body electrodes 250 and 260 composed of the alloys have lower thermal conductivity.

The thickness of the first and second main body electrodes 250 and 260 is preferably equal to or larger than 45 µm. Alternatively, the thickness of the first and second main body electrodes 250 and 260 is preferably equal to or larger than a half of the distance between the first main body electrodes 250 with the recessed region R3 being interposed therebetween. The thickness of the first and second main body electrodes 250 and 260 is preferably approximately 45 to 100 µm and more preferably approximately 50 to 75 µm in view of a manufacturing process. The film thickness is preferably equal to or larger than 45 µm, because if the film thickness is too thin, the first and second main body electrodes 250 and 260 are easily affected by warpage of the wafer and thus it is difficult to planarize the surfaces of the main body electrodes 250 and 260.

Furthermore, the first and second main body electrodes 250 and 260 can be readily formed to have the film thickness of 45 µm or more by the electrolytic plating method included in a wet plating method, without using a method included in a dry plating method such as vapor deposition which is used in a wafer manufacturing process. If an electrode having the same film thickness as the first and second main body electrodes 250 and 260 is formed by deposition or the like, it is very inefficient because it takes a long time, which is not realistic. Conversely, if the first and second main body electrodes 250 and 260 are produced not by the electrolytic plating method but by deposition or the like within the realistic time, the film thickness is substantially as thin as the film thickness of the p-electrode 22 and the n-electrode 23, and thus the first main body electrode 250 cannot be made completely flat. Consequently, the planar view shape of the uppermost surface of the first main body electrode 250 is substantially the same as the planar view shape of the first region R1, and the area of the first main body electrode 250 that contacts electrode pads on a package in flip-chip mounting cannot be increased. If the first and second main body electrodes 250 and 260 cannot be made thick, the height of side wall surfaces of the first and second plated electrodes 25 and 26 is reduced and an effect of preventing the migration of metal atoms in a solder material, which is described above, is also reduced.

As shown in FIGS. 5 and 6, in the cross-sectional structure of the first main body electrode 250 and the second main body electrode 260 produced by the electrolytic plating method, the seed film 30 for feeding a power in electrolytic plating is formed under the first main body electrode 250 and the second main body electrode 260. The power-feeding seed film 30 for electrolytic plating is composed of a Ni film or a Ti/Cu film having a film thickness of approximately 10 to 100 nm. The seed film 30 is not limited to the Ni film or the Ti/Cu film as long as the seed film 30 is composed of an electrically conductive material that has the adhesion to the protective insulating film 24 under the seed film 30 and the first and second main body electrodes 250 and 260 on the seed film 30.

As described above, the first and second surface metal films 251 and 261 are a single-layer or multi-layer metal film that covers the surfaces (the upper surfaces and side wall surfaces) of the first and second main body electrodes 250 and 260. The outermost layers of the first and second surface metal films 251 and 261 are composed of a metal having smaller ionization tendency than copper composing the first and second main body electrodes 250 and 260 (for example, gold (Au), platinum group metals (Ru, Rh, Pd, Os, Ir, Pt, or two or more alloys thereof), or alloys of gold and platinum group metals). Consequently, even if the present light-emitting element 11 is stored in the oxygen atmosphere during a period before being flip-chip mounted, the surfaces of the first and second plated electrodes 25 and 26 are less oxidized as compared to the surfaces without being covered by the first and second surface metal films 251 and 261. In addition, it is possible to prevent the covered surfaces from being oxidized in a high temperature process during a soldering process at the time of flip-chip mounting. Moreover, it is possible to reduce the migration of metal atoms in the first and second plated electrodes 25 and 26, as described above.

In the present embodiment, the first and second surface metal films 251 and 261 are composed of three metal films of Ni/Pd/Au in this order from the bottom, and are produced by a well-known electroless plating method, which is a wet plating method. The film thicknesses of the Ni/Pd/Au layers of the first and second surface metal films 251 and 261 are, for example, 3 to 7.5 μm/50 to 150 nm/50 to 150 nm in this order from the bottom. The first and second surface metal films 251 and 261 do not need to be composed of three metal films, and may be composed of a single metal film or multi-layer metal films other than three layers. In addition, while the materials for the first and second surface metal films 251 and 261 are not limited to the metals mentioned above, the outermost layer is preferably composed of gold (Au).

While the planar view shape of the first and second regions R1 and R2, the protective insulating film 24, and the first and second plated electrodes 25 and 26 is line-symmetrical to the X and Y axes, the planar view shape does not need to be line-symmetrical to the X and Y axes. For example, the second plated electrodes 26 and the second openings 29 do not need to be provided at four corners of the element region RE, and any number of the second plated electrodes 26 and the second openings 29 may be provided at any positions in the surrounding region R4. For example, the second plated electrodes 26 and the second openings 29 may be provided at two diagonal corners in the surrounding region R4. In addition, the planar view shape of the first region R1, the p-electrode 22, and the first opening 28 is not limited to the comb-like shape as shown in FIGS. 7 to 10. Moreover, the first region R1 does not need to have the planar view shape including a recess part surrounding the second region R2 by three sides.

As shown in FIGS. 5 and 6, although not shown in FIG. 10, the fluororesin film 27 is formed on the upper surface of the protective insulating film 24 or the upper surfaces of the protective insulating film 24 and the n-type cladding layer 16 that is exposed on a bottom surface of a gap part 31 between the first plated electrode 25 and the second plated electrode 26 in the second region R2 and the side wall surfaces of the first and second plated electrodes 25 and 26.

In the present embodiment, the gap part 31 between the first plated electrode 25 and the second plated electrode 26 means a region within the element region RE where the first and second plated electrodes 25 and 26 are not formed, and also includes the region between the outline of the element region RE and the outer circumference of the first plated electrode 25 and the region between the outline of the element region RE and the outer circumference of the second plated electrode 26. When the protective insulating film 24 covers the entire exposed surface of the n-type cladding layer 16 that is not covered by the n-electrode 23, the upper surface of the n-type cladding layer 16 is not exposed on the bottom surface of the gap part 31 between the first and second plated electrodes 25 and 26.

In the present embodiment, the fluororesin film 27 is composed of, for example, an amorphous fluororesin that is the same as an amorphous fluororesin used for sealing the present light-emitting element 11 as being flip-chip mounted. In general, examples of the amorphous fluororesin include an amorphized polymer alloy obtained by copolymerizing a fluororesin of a crystalline polymer, a copolymer of perfluorodioxole (Trade Name "Teflon AF" (registered trademark) manufactured by Du Pont), and a cyclopolymerization product of perfluorobutenyl vinyl ether (Trade Name "CYTOP" (registered trademark) manufactured by Asahi Glass Co., Ltd.). The amorphous fluororesin used for the fluororesin film 27 in the present embodiment is described in detail in the description of a step of forming the fluororesin film 27.

Next, a manufacturing method of the present wafer 10 (the present manufacturing method) is described. The present manufacturing method is divided into three processes: a process of manufacturing the before-plating element structure shown in FIGS. 2 to 4 (first manufacturing process) before the protective insulating film 24, the first plated electrode 25, and the second plated electrode 26 are formed, a manufacturing process of forming the protective insulating film 24, the first plated electrode 25, and the second plated electrode 26 included in the after-plating element structure shown in FIGS. 5 and 6 (second manufacturing process), and a manufacturing process of forming the fluororesin film 27 (third manufacturing process). The first manufacturing process is briefly described first.

Firstly, the template 15 described above and the layers from the n-type cladding layer 16 to the p-type contact layer 20 are formed on the sapphire (0001) substrate 12 by a well-known growth method such as MOVPE. After the p-type contact layer 20 is formed, a thermal process is performed at, for example, 800° C. for the purpose of activating acceptor impurities. Next, the surface of the p-type contact layer 20 in the first region R1 is covered by, for example, an Ni mask using a well-known photolithography technique, the layers from the active layer 17 to the p-type contact layer 20 above the n-type cladding layer 16 in the region other than the first region R1 are removed by reactive ion etching or the like until the surface of the n-type cladding layer 16 is exposed, and the Ni mask is then removed. As a result, in the first region R1, the semiconductor laminated portion 21 from the n-type cladding layer 16 to the p-type contact layer 20 is formed on the template 15, whereas in the second region R2, the n-type cladding layer 16 including the exposed surface is formed on the template 15.

A photoresist with an inverted pattern of the n-electrode 23 is then formed on the entire substrate, four-layer metal films of Ti/Al/Ti/Au, which become the n-electrode 23, are deposited on the substrate by an electron beam deposition method or the like, the photoresist is removed by lift-off for the purpose of peeling off the four-layer metal films on the photoresist, and a thermal process is performed by RTA (rapid thermal anneal) or the like if necessary, so that the n-electrode 23 is formed on the n-type cladding layer 16. The film thicknesses of the four-layer metal films of Ti/Al/Ti/Au are, for example, 20 nm/100 nm/50 nm/100 nm in this order.

A photoresist with an inverted pattern of the p-electrode 22 is then formed on the entire substrate, two-layer metal films of Ni/Au, which become the p-electrode 22, are deposited on the substrate by an electron beam deposition method or the like, the photoresist is removed by lift-off for the purpose of peeling off the two-layer metal films on the photoresist, and a thermal process is performed at, for example, 450° C. by RTA or the like, so that the p-electrode 22 is formed on the surface of the p-type contact layer 20. The film thicknesses of the two-layer metal films of Ni/Au are, for example, 60 nm/50 nm in this order.

In this way, the before-plating element structure of the present light-emitting element 11 shown in FIGS. 2 to 4 is completed. The before-plating element structure shown in FIGS. 2 to 4 includes the semiconductor laminated portion 21, the p-electrode 22, and the n-electrode 23 that are required as a light-emitting element. Consequently, at this stage, if an element unit obtained by dicing the present wafer 10 is mounted on a submount or the like by flip-chip mounting or the like and sealed with resin, the element unit can function as the light-emitting element.

However, to easily perform a soldering process at the time of flip-chip mounting, to efficiently radiate waste heat generated during a light-emitting operation, and to reduce the migration of metal atoms in an electrode and a solder material, in the present light-emitting element 11, the protective insulating film 24, the first and second plated electrodes 25 and 26, and the fluororesin film 27 are further formed on the before-plating element structure shown in FIGS. 2 to 4. Next, the second manufacturing process is described.

The protective insulating film 24 such as a $SiO_2$ film or an $Al_2O_3$ film is then formed on the entire substrate by, for example, a CVD method. The protective insulating film 24 has a film thickness of, for example, approximately 150 to 350 nm. The film forming temperature of the protective insulating film 24 is equal to or lower than the lowest temperature of a film forming temperature and a thermal process temperature that are applied before the before-plating element structure shown in FIGS. 2 to 4 is formed, for example, approximately 600° C.

Apart of the protective insulating film 24 formed on the entire substrate is then removed by etching. Specifically, the region other than the first opening 28, the second opening 29, and the scribe region SL is covered by a mask layer using a well-known photolithography technique, the protective insulating film 24 formed on the entire substrate is removed by dry etching such as well-known reactive ion etching, and then the mask layer is removed. As a result, in the element region RE, the first opening 28 and the second opening 29 are formed in the protective insulating film 24. A process of manufacturing a nitride semiconductor wafer has been described above. A plating manufacturing process is described below. The accuracy of alignment is reduced in the plating manufacturing process. The plating manufacturing process to be described below is performed in a wafer state subsequently to the wafer manufacturing process described above.

Subsequently, the power-feeding seed film 30 such as Ni film to be used for electrolytic plating is formed on the entire substrate by sputtering or the like.

A photosensitive sheet film for plating is then adhered on the seed film 30, and the photosensitive sheet film on the portions in which the first plated electrode 25 and the second plated electrode 26 are formed is exposed to light and developed using a photolithography technique to be removed, so that the seed film 30 is exposed. A power is then applied to the seed film 30 to form the first main body electrode 250 and the second main body electrode 260 on the exposed seed film 30 by an electrolytic plating method. The sheet film that is not covered by the first main body electrode 250 and the second main body electrode 260 is then removed using an organic solvent or the like, and the seed film 30 that is not covered by the first main body electrode 250 and the second main body electrode 260 is removed by wet etching or the like.

Immediately after the first main body electrode 250 and the second main body electrode 260 are formed, the film thicknesses thereof are substantially the same. However, the first main body electrode 250 is formed to extend across the first region R1 and a part of the second region R2, and the mesa, the p-electrode 22, the n-electrode 23, and the first opening 28 in the protective insulating film 24 have respective step differences under the first main body electrode 250. In addition, the intensity of an electric field applied to the seed film 30 may not be uniform in the electrolytic plating method mentioned above. Thus, immediately after the first main body electrode 250 and the second main body electrode 260 are formed, the film thicknesses thereof may be different from each other. Consequently, because of the respective step differences and the differences in film thicknesses, recesses and projections corresponding to the step differences may be formed on the upper surface of the first main body electrode 250 immediately after the first main body electrode 250 is formed, and thus the upper surface of the first main body electrode 250 may not have the same height as the upper surface of the second main body electrode 260. In the present embodiment, "height" means the Z-direction distance when a certain position in the Z direction (for example, the surface of the substrate 12) is set as a reference.

Consequently, in the present embodiment, the upper surfaces of the first and second main body electrodes 250 and 260 are then polished by a well-known polishing method such as CMP (chemical mechanical polishing) to remove the recesses and projections on the upper surfaces of the first and second main body electrodes 250 and 260 and planarize the upper surfaces, and to allow the upper surfaces of the first and second main body electrodes 250 and 260 to have the same height. The film thickness of the polished first main body electrode 250 and second main body electrode 260 (the height of the seed film 30 in the second region R2 from its upper surface) is preferably approximately 50 to 75 μm as described above. The sheet film and the seed film 30 may be removed after the polishing step described above.

After the upper surfaces of the first and second main body electrodes 250 and 260 are polished, the first and second surface metal films 251 and 261 composed of three-layer metal films of Ni/Pd/Au in this order from the bottom are formed on exposed surfaces of the uppermost surfaces and the side wall surfaces of the first and second main body electrodes 250 and 260 by a well-known electroless plating method, which is a wet plating method. The film thicknesses of the Ni/Pd/Au layers are, for example, 3 to 7.5 μm/50 to 150 nm/50 to 150 nm in this order from the bottom.

The first and second plated electrodes 25 and 26 are formed by the second manufacturing process described above. The first plated electrode 25 is electrically connected via the seed film 30 immediately under the first plated electrode 25 to the surface of the p-electrode 22 that is exposed through the first opening 28 in the protective insulating film 24. In addition, the second plated electrode 26 is electrically connected via the seed film 30 immediately under the second plated electrode 26 to the surface of the n-electrode 23 that is exposed through the second opening 29 in the protective insulating film 24.

Next, the third manufacturing process of forming the fluororesin film 27 is described with reference to FIGS. 11 to 15.

A negative photoresist material that does not contain fluorine is spin-coated on the entire surface of the present wafer 10 having the first and second plated electrodes 25 and 26 formed thereon, thus forming a photoresist layer (step A1). Ultraviolet light of a wavelength suitable for the exposure of the photoresist layer is then irradiated onto the substrate 12 from the rear surface side. The irradiated ultraviolet light transmits through the template 15 and the semiconductor laminated portion 21 but cannot transmit through the p-electrode 22, the n-electrode 23, the first plated electrode 25, and the second plated electrode 26, so that the photoresist layer formed on the scribe region SL where these electrodes are not formed is exposed to the light (step A2). More precisely, the scribe region SL and the side region of the scribe region SL outside the outer circumferential line of the n-electrode 23 of each element unit are exposed to the light. In the present embodiment, the entire outer circumferential line of the first plated electrode 25 is on the n-electrode 23 with the protective insulating film 24 interposed therebetween, and thus all the regions inside the n-electrode 23 are covered by the first plated electrode 25. That is, the n-electrode 23 and the first plated electrode 25 are used as a mask for the exposure of the photoresist layer.

Figure 11:
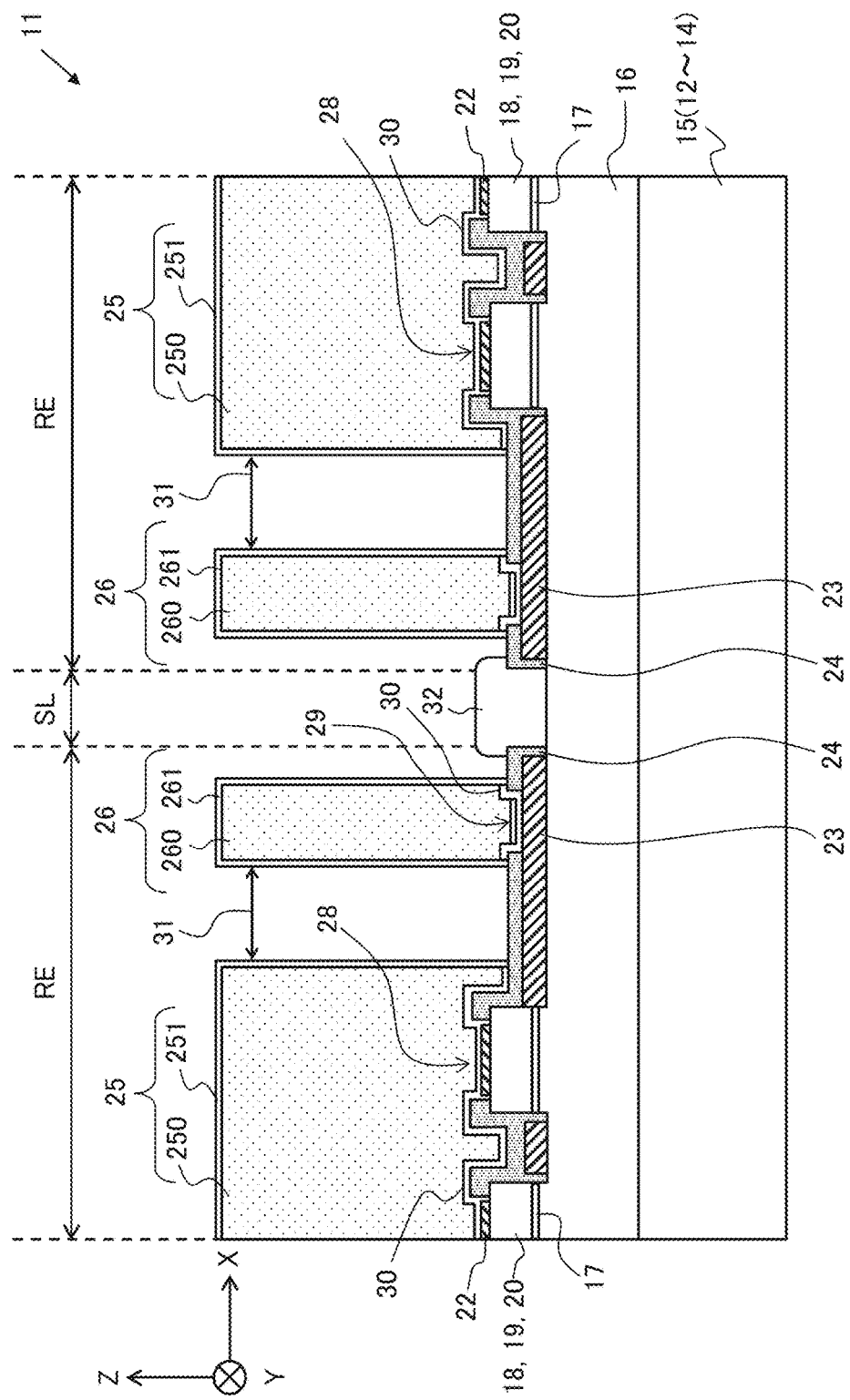
FIG. 11 is a process cross-sectional view schematically showing an embodiment of a process of forming a fluororesin film in a manufacturing method of a nitride semiconductor wafer according to the present invention.

The photoresist layer that is masked by the n-electrode 23 and the first plated electrode 25 and is not exposed to the light is then removed by a development process (step A3). As shown in FIG. 11, the photoresist layer formed on the scribe region SL and the side region thereof becomes a first mask material 32 that blocks the formation of the fluororesin film 27. The film thickness of the photoresist layer formed on the scribe region SL is, for example, approximately 0.1 to 5 μm, and is thicker than the total film thickness of the protective insulating film 24 and the n-electrode 23 in the second region R2. The upper surface of the photoresist layer on the scribe region SL is at a higher position than the upper surface of the protective insulating film 24 in the gap part 31.

Figure 12:
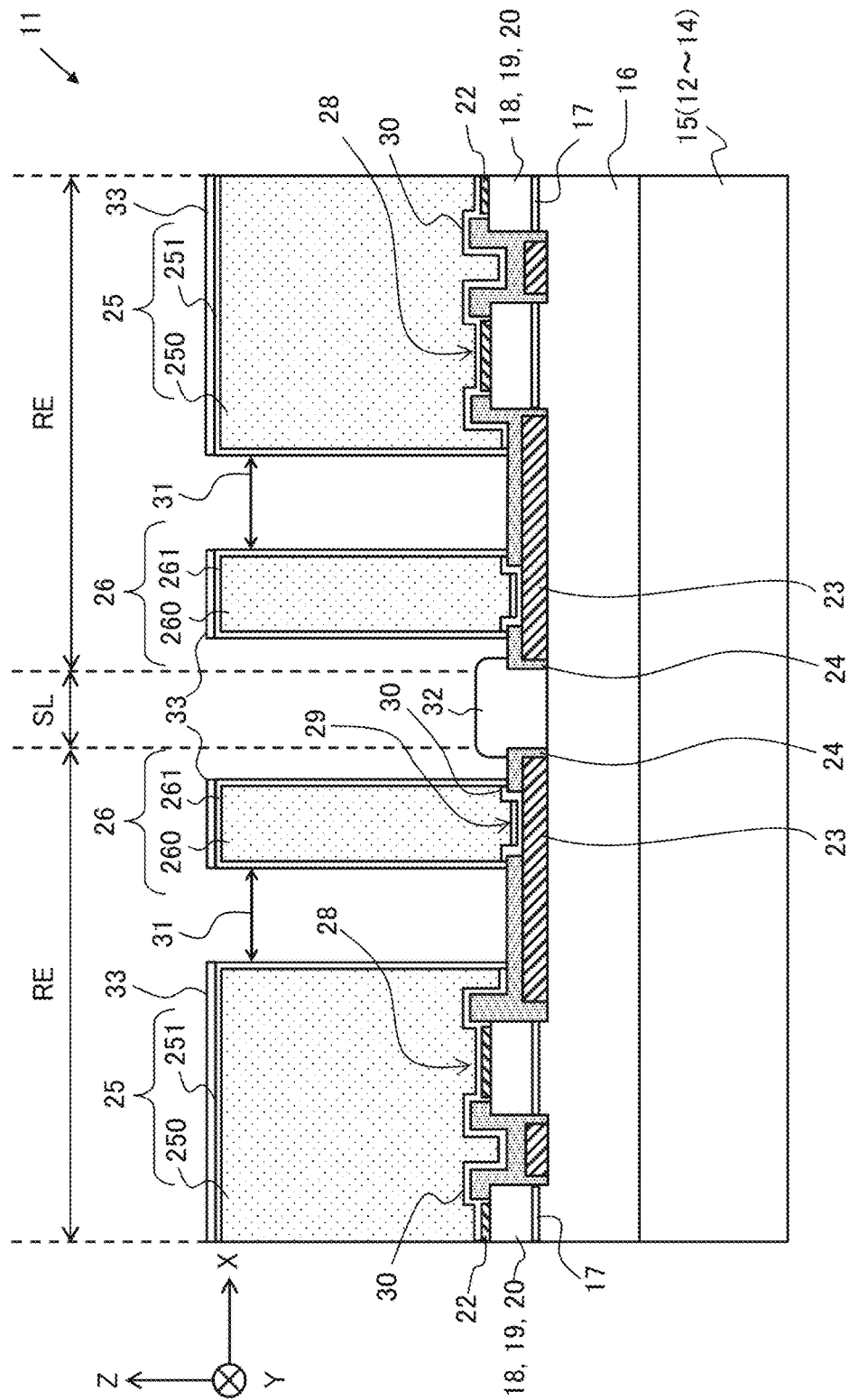
FIG. 12 is a process cross-sectional view schematically showing the embodiment of the process of forming a fluororesin film in the manufacturing method of a nitride semiconductor wafer according to the present invention.

As shown in FIG. 12, a second mask material 33 that blocks the formation of the fluororesin film 27 is then applied on the upper surfaces of the first plated electrode 25 and the second plated electrode 26 on the entire surface of the present wafer 10 (step A4). The second mask material 33 is a resin composition obtained by mixing a binding resin that does not contain fluororesin (an acryl resin, an epoxy resin, a cellulose resin, a phenol resin, an urethane resin, or the like), an organic solvent, and an additive selected as needed, and for example, an ink for screen printing or the like may be used. In the present embodiment, the height of the upper surface of the first plated electrode 25 is substantially equal to the height of the upper surface of the second plated electrode 26. Consequently, for example, the second mask material 33 is applied on a surface of a flat plate with a larger area than the present wafer 10 and the applied surface of the flat plate is pressed against the surface of the present wafer 10, so that the second mask material 33 is transferred from the surface of the flat plate to the entire upper surfaces of the first plated electrode 25 and the second plated electrode 26. After transferring the second mask material 33, the second mask material 33 is fixed on the upper surfaces of the first plated electrode 25 and the second plated electrode 26 by heating or irradiation of ultraviolet light (step A5). In this case, the second mask material 33 preferably has a viscosity that the second mask material 33 does not drip on the side wall surfaces of the first plated electrode 25 and the second plated electrode 26 during transfer (1 to 100 Pa·s). If the second mask material 33 drips on the side wall surface during transfer, any problem does not occur as long as the dripping mask material covers only an upper end part of the side wall surface. In addition, if the second mask material 33 is colored by a pigment or a dye, it is convenient to visually or optically check whether the second mask material 33 has been accurately transferred to the upper surfaces of the first plated electrode 25 and the second plated electrode 26.

Figure 13:
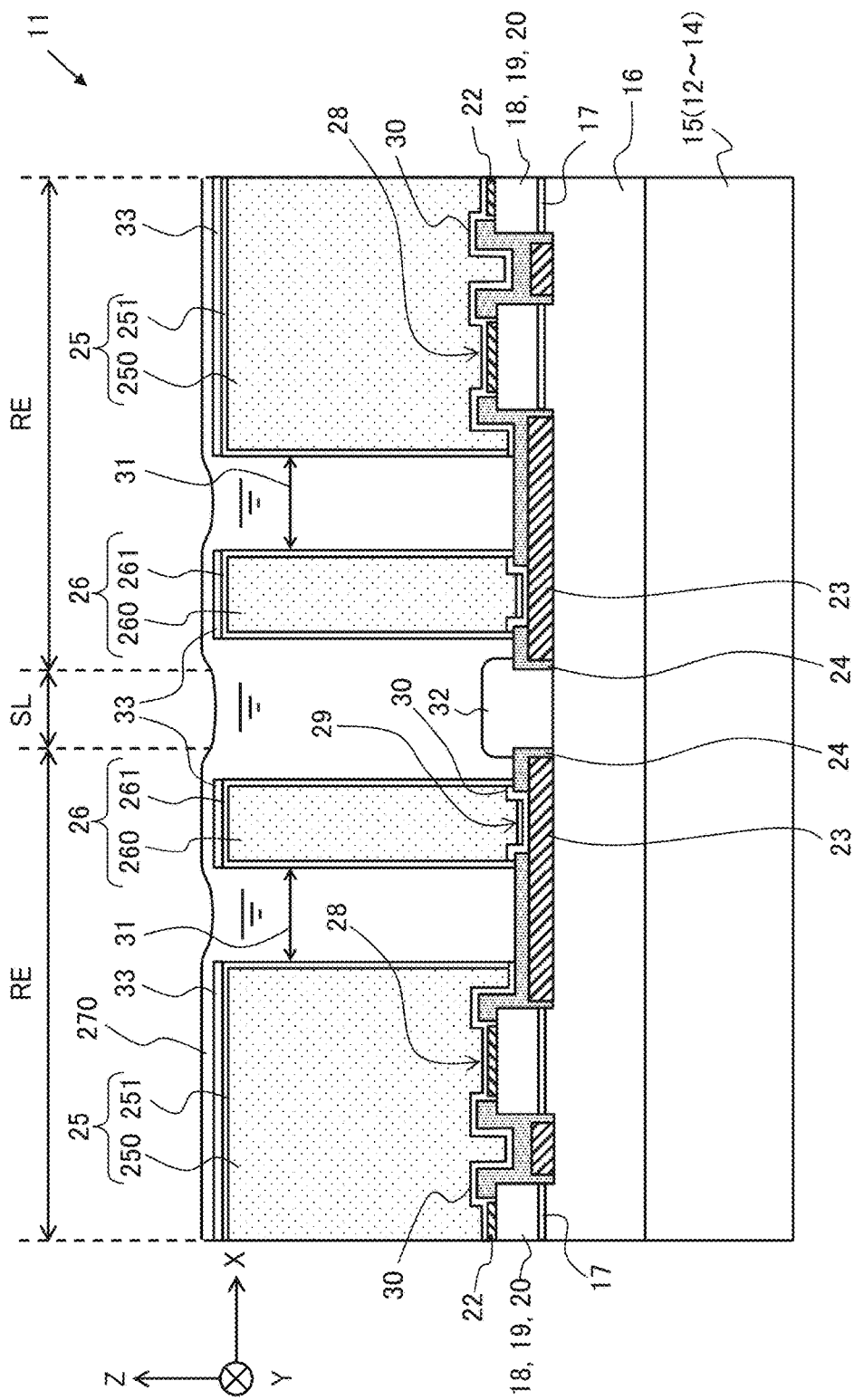
FIG. 13 is a process cross-sectional view schematically showing the embodiment of the process of forming a fluororesin film in the manufacturing method of a nitride semiconductor wafer according to the present invention.

As shown in FIG. 13, a coating liquid 270 prepared by diluting a fluororesin that becomes the fluororesin film 27 with a solvent is injected on the entire surface of the present wafer 10 having the first mask material 32 and the second mask material 33 formed thereon using, for example, a spin coater (step A6). The injected amount of the coating liquid 270 is such that the second mask material 33 on the first and second plated electrodes 25 and 26 is slightly covered by the coating liquid 270. The coating liquid 270 is injected to cover the upper surfaces and the side wall surfaces of the first and second plated electrodes 25 and 26 and the exposed surface of the protective insulating film 24 that is exposed on the bottom surface of the gap part 31 between the first and second plated electrodes 25 and 26. The coating liquid 270 may be injected on the surface of the present wafer 10 by, in addition to spin coating, an ink-jet system, a dispenser, or potting.

Figure 14:
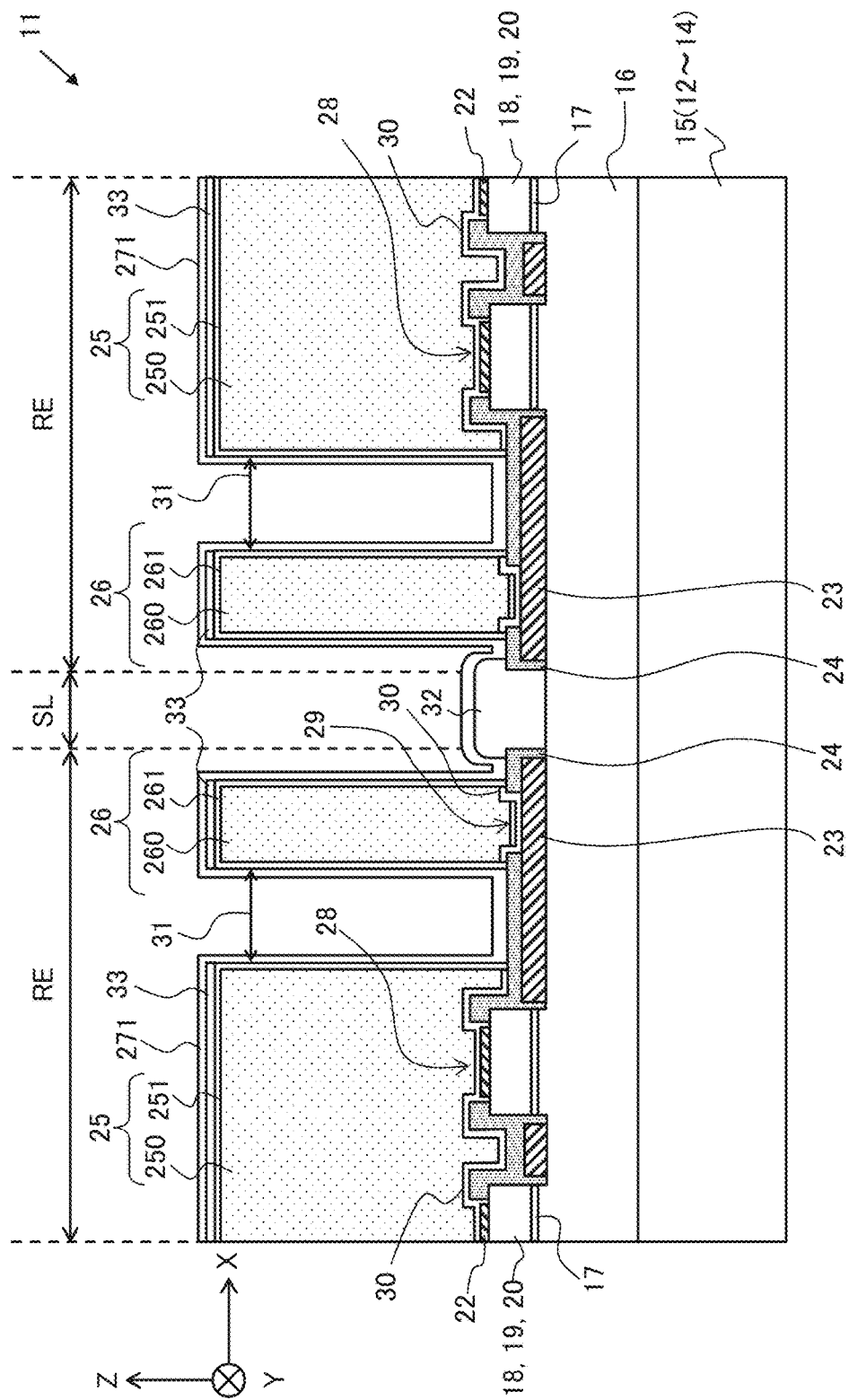
FIG. 14 is a process cross-sectional view schematically showing the embodiment of the process of forming a fluororesin film in the manufacturing method of a nitride semiconductor wafer according to the present invention.

As shown in FIG. 14, the coating liquid 270 is gradually heated to evaporate the solvent, and a base resin film 271, which is a raw film before being shaped into the fluororesin film 27, is formed on the entire present wafer 10 along recesses and projections on the upper surface of the present wafer 10 (step A7). At this time, the base resin film 271 is formed in a manner that the height of the upper surface of the coating liquid 270 is gradually reduced along the recesses and projections on the upper surface of the present wafer 10 depending on the concentration of a fluororesin in the coating liquid 270, and the side wall surfaces of the first and second plated electrodes 25 and 26 and the exposed surface of the protective insulating film 24 that is exposed on the gap part 31 between the first and second plated electrodes 25 and 26 are covered. The base resin film 271 is also formed on the upper and side surfaces of the first mask material 32 and the second mask material 33. It is only required that the base resin film 271 tightly covers the side wall surfaces of the first and second plated electrodes 25 and 26 and the bottom surface of the gap part 31 and it is not necessary to unnecessarily increase the film thickness. For example, the film thickness may be the thickness of a few atomic layers (approximately 10 nm). In addition, the film thickness is determined depending on the concentration of the fluororesin in the coating liquid 270 and a portion in which the base resin film 271 is formed, and preferably is, for example, approximately 0.1 to 1 μm.

Figure 15:
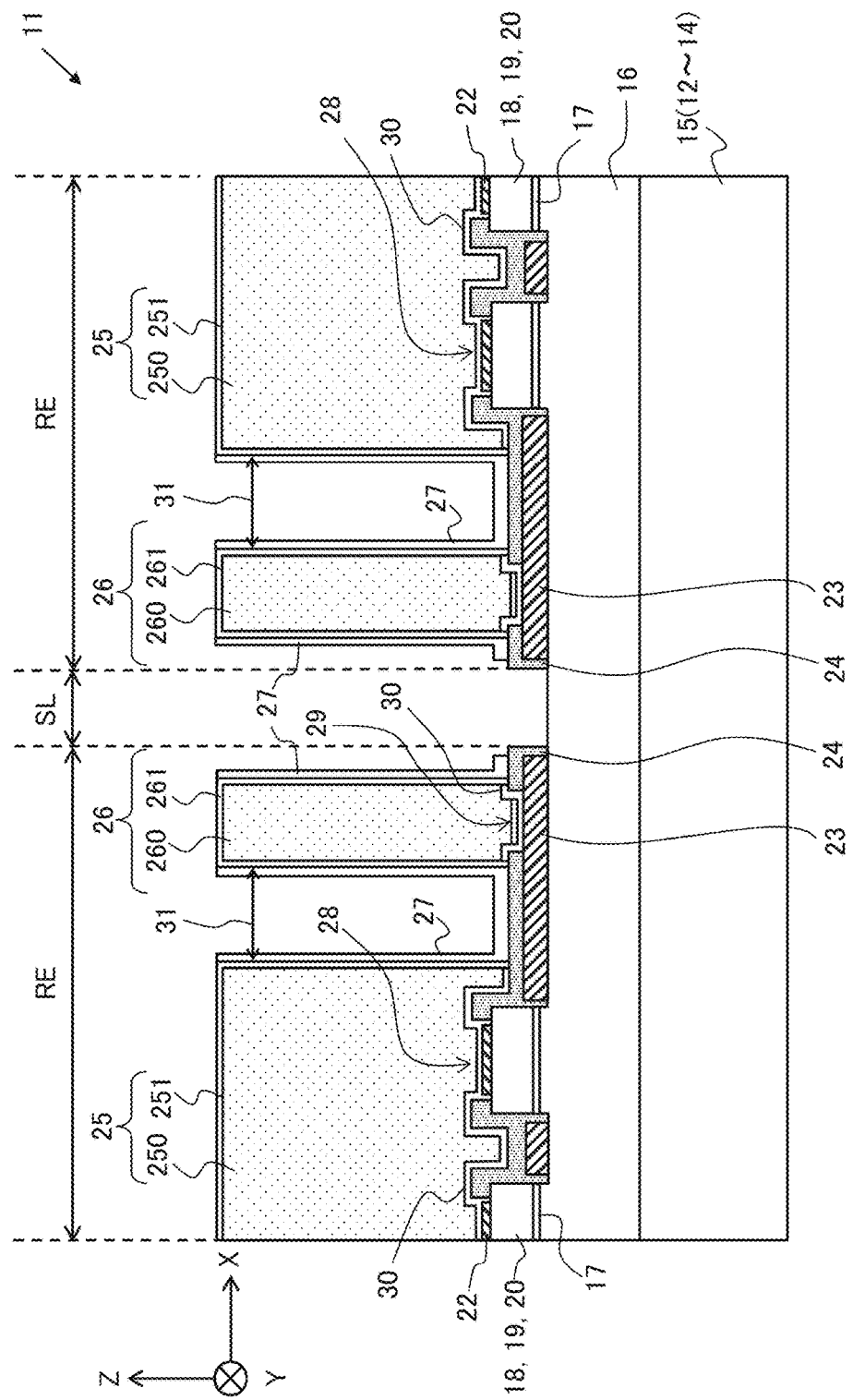
FIG. 15 is a process cross-sectional view schematically showing the embodiment of the process of forming a fluororesin film in the manufacturing method of a nitride semiconductor wafer according to the present invention.

After the base resin film 271 is formed, the first mask material 32 and the second mask material 33 are then dissolved by an organic solvent that dissolves the first mask material 32 and the second mask material 33 (for example, acetone) (step A8). At this time, the organic solvent used is an organic solvent that does not dissolve the fluororesin composing the base resin film 271 but transmits through the fluororesin to dissolve the first mask material 32 and the second mask material 33. As the dissolved first mask material 32 and the dissolved second mask material 33 are washed and removed, the base resin film 271 that covers the upper surfaces of the first mask material 32 and the second mask material 33 is also removed. As a result, as shown in FIG. 15, the fluororesin film 27 that covers the side wall surface of the first plated electrode 25, the side wall surface of the second plated electrode 26, and the exposed surface of the protective insulating film 24 that is exposed on the gap part 31 between the first plated electrode 25 and the second plated electrode 26 is formed. If an appropriate organic solvent that does not dissolve the fluororesin composing the base resin film 271 but simultaneously dissolves the first mask material 32 and the second mask material 33 is not available, the first mask material 32 may be dissolved by a first organic solvent that does not dissolve the fluororesin but dissolves the first mask material 32, and the second mask material 33 may be dissolved by a second organic solvent that does not dissolve the fluororesin but dissolves the second mask material 33.

The fluororesin film 27 is formed on portions that have not been covered by the first mask material 32 and the second mask material 33. While the first mask material 32 basically covers the scribe region SL, the n-electrode 23 and the first plated electrode 25 are used as a mask in the exposure process described above and thus the first mask material 32 is also formed on the side region of the scribe region SL, which is between the outer circumferential line of the n-electrode 23 and the scribe region SL. Consequently, the fluororesin film 27 is not formed outside the outer circumferential line of the n-electrode 23 (corresponding to the outer circumferential edge of the exposed surface of the protective insulating film 24). The fluororesin film 27 is used as a solder resist material that prevents a solder material from being adhered to portions of the gap part 31 between the first plated electrode 25 and the second plated electrode 26 where the first plated electrode 25 and the second plated electrode 26 oppose to each other in soldering during flip-chip mounting. In addition, the fluororesin film 27 is used for preventing a short-circuit between the first plated electrode 25 and the second plated electrode 26 caused by the migration of metal atoms in the solder material. Consequently, if the fluororesin film 27 is not formed outside the outer circumferential line of the n-electrode 23 as described above, the predetermined object is achieved. In addition, the second mask material 33 is basically formed on the uppermost surfaces of the first plated electrode 25 and the second plated electrode 26. If the second mask material 33 is extended a little from the uppermost surface to cover an upper end part of the side wall surface, a large part of the side wall surface below the upper end part is covered by the fluororesin film 27, and thus it is possible to sufficiently prevent the solder material from being adhered to the portions of the gap part 31 between the first plated electrode 25 and the second plated electrode 26 where the first plated electrode 25 and the second plated electrode 26 oppose to each other.

Next, the coating liquid 270 used for forming the fluororesin film 27 is briefly described. In the light-emitting device obtained by flip-chip mounting the present light-emitting element 11, ultraviolet light emitted from the active layer 17 passes through the substrate 12 to be emitted from the rear surface of the substrate 12 and passes through a sealing resin to be radiated outside. The portion in which the fluororesin film 27 is formed is on the upper surface side of the present light-emitting element 11, which is opposite to the rear surface of the substrate 12 from which the ultraviolet light is emitted, and thus the fluororesin film 27 is not necessarily same as a fluororesin that is transparent to the ultraviolet light used for the sealing resin.

However, in a resin sealing process during flip-chip mounting, the sealing resin is also filled in a void remaining in the gap part 31 between the first plated electrode 25 and the second plated electrode 26 after the fluororesin film 27 is formed. Consequently, an amorphous fluororesin that is appropriately used as the sealing resin is used as the fluororesin used for the coating liquid 270 in the present embodiment.

There are roughly two types of the amorphous fluororesin: a non-bonding fluororesin (first type amorphous fluororesin) having non-reactive functional groups including a terminal functional group that is not bondable to metal and a bonding fluororesin (second type amorphous fluororesin) having reactive functional groups including a terminal functional group bondable to metal. In an aspect of the present embodiment, the first type amorphous fluororesin that is highly effective to prevent migration of metal atoms is used.

More specifically, in the first type amorphous fluororesin, the structural unit that constitutes a polymer or a copolymer has a fluorine-containing aliphatic cyclic structure and the terminal functional group is a perfluoroalkyl group such as $CF_3$. That is, the first type amorphous fluororesin does not have the reactive terminal functional group bondable to metal. On the other hand, the reactive functional group of the second type amorphous fluororesin is, for example, a carboxyl group (COOH) or an ester group (COOR). R denotes an alkyl group.

The unit based on a cyclic fluorine-containing monomer (hereinafter, "unit A") or the unit formed by cyclopolymerization of diene fluorine-containing monomers (hereinafter, "unit B") is preferable as the structural unit with the fluorine-containing aliphatic cyclic structure. The composition and structure of the amorphous fluororesin are not the subject of the invention of the present application, and thus detailed descriptions of the unit A and the unit B are omitted. For reference, the unit A and the unit B are described in detail in paragraphs [0031] to [0062] of Patent Document 1 by the same applicant as the present application.

The coating liquid 270 is produced by dissolving the first type amorphous fluororesin in a fluorine-containing solvent, preferably an aprotic fluorine-containing solvent. For reference, the fluorine-containing solvent is described in detail in paragraphs [0067] to [0073] of Patent Document 1. The concentration of the first type amorphous fluororesin in the coating liquid 270 is adjusted in a manner that the fluororesin film 27 has the film thickness described above (approximately 0.1 to 1 μm).

An example of commercially available products of the first type amorphous fluororesin is CYTOP (manufactured by Asahi Glass Co., Ltd.). CYTOP having a $CF_3$ terminal functional group is a copolymer of the unit B shown in the following Chemical 1.

[Chemical 1]

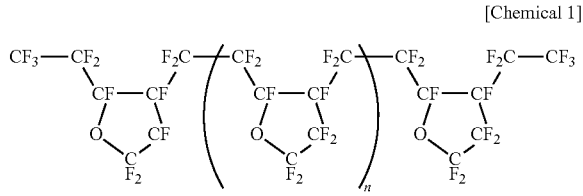

Through the steps described above, the present wafer 10 that includes the first plated electrode 25, the second plated electrode 26, and the fluororesin film 27 is completed.

When the present wafer 10 is completed, the present light-emitting element 11 is in a wafer state. A predetermined inspection step is then performed and the present wafer 10 is cut or divided along the scribe regions SL by a well-known dicing technique, so that the present light-emitting element 11 in a chip state is obtained.

Second Embodiment

Next, another embodiment of the present wafer 10 and the present light-emitting element 11 is described as a modification of the first embodiment. A present wafer 10 and a present light-emitting element 11 according to a second embodiment have the same element structure as in the first embodiment, but are different from those of the first embodiment in detailed parts of the third manufacturing process in the manufacturing method of the present wafer 10. The different parts in the third manufacturing process are described below.

In the third manufacturing process of the first embodiment, the first mask material 32 constituted by a photoresist layer is formed on the scribe region SL and the side region thereof at steps A1 to A3. In the second embodiment, instead of steps A1 to A3, the photoresist material used at step A1 or the second mask material 33 used at the step A4 are applied as the first mask material 32 on the scribe region SL by an ink-jet system (step B1), and the applied first mask material 32 is then fixed on the scribe region SL by heating, ultraviolet irradiation, or the like (step B2). The film thickness of the first mask material 32 formed on the scribe region SL is, for example, approximately 0.1 to 5 μm similarly to the first embodiment, which is larger than the total film thickness of the protective insulating film 24 and the n-electrode 23 in the second region R2. The position of the upper surface of the first mask material 32 on the scribe region SL is thus higher than that of the upper surface of the protective insulating film 24 in the gap part 31.

After steps B1 and B2, steps A4 to A8 described in the first embodiments are performed in the same manner. As a result, it is possible to form the fluororesin film 27 that does not cover the scribe region SL and the upper surfaces of the first plated electrode 25 and the second plated electrode 26 but covers the side wall surface of the first plated electrode 25, the side wall surface of the second plated electrode 26, and the exposed surface of the protective insulating film 24 exposed on the gap part 31 between the first plated electrode 25 and the second plated electrode 26. In the second embodiment, the first mask material 32 is not formed on the side region of the scribe region SL, which is between the outer circumferential line of the n-electrode 23 and the scribe region SL. Consequently, the fluororesin film 27 is also formed outside the outer circumferential line of the n-electrode 23 (corresponding to the outer circumferential edge of the exposed surface of the protective insulating film 24).

Third Embodiment

Next, yet another embodiment of the present wafer 10 and the present light-emitting element 11 is described as a modification of the first or second embodiment. A present wafer 10 and a present light-emitting element 11 according to a third embodiment have the same element structure as in the first embodiment, but are different from those of the first and second embodiments in detailed parts of the third manufacturing process in the manufacturing method of the present wafer 10. The different parts in the third manufacturing process are described below.

In the third manufacturing process of the first embodiment, the second mask material 33 is formed in advance on the upper surfaces of the first plated electrode 25 and the second plated electrode 26 at steps A4 and A5, and then the coating liquid 270 is injected at step A6 on the entire surface of the present wafer 10 having the first mask material 32 and the second mask material 33 formed thereon. In the third embodiment, steps A4 and A5 are not performed, that is, the second mask material 33 is not formed in advance on the upper surfaces of the first plated electrode 25 and the second plated electrode 26 and the coating liquid 270 is injected at step A6 on the entire surface of the present wafer 10 having the first mask material 32 formed thereon. After step A6, steps A7 and A8 are performed in the same manner as described in the first embodiment. As a result, it is possible to form the fluororesin film 27 that does not cover the scribe region SL but covers the upper surfaces of the first and second plated electrodes 25 and 26, the side wall surfaces of the first and second plated electrodes 25 and 26, and the exposed surface of the protective insulating film 24 exposed on the gap part 31 between the first and second plated electrodes 25 and 26. The fluororesin film 27 formed on the upper surfaces of the first and second plated electrodes 25 and 26 is then removed by a well-known polishing method such as CMP (chemical mechanical polishing) in a manner that the outermost surfaces of the first and second surface metal films 251 and 261 are exposed and metal of the outermost layer (Au) remains on the upper surfaces of the first and second plated electrodes 25 and 26 (step A9). As a result, it is possible to form the fluororesin film 27 that does not cover the scribe region SL and the upper surfaces of the first plated electrode 25 and the second plated electrode 26 but covers the side wall surface of the first plated electrode 25, the side wall surface of the second plated electrode 26, and the exposed surface of the protective insulating film 24 exposed on the gap part 31 between the first plated electrode 25 and the second plated electrode 26.

In the third embodiment, metal of the outermost layers of the first and second surface metal films 251 and 261 is polished to a certain degree by polishing at step A9 to become thin. Consequently, when the first and second surface metal films 251 and 261 are formed by electroless plating, the film thickness of the outermost layers is preferably larger than the film thicknesses in the first and second embodiments. Instead of setting the film thickness of the outermost layers of the first and second surface metal films 251 and 261 to be larger than those of the first and second embodiments, or in addition thereto, after polishing at step A9, metal of the outermost layer (Au) may be formed again on the exposed surfaces of the first and second surface metal films 251 and 261 by electroless plating.

The yet another embodiment of not performing steps A4 and A5 described above but instead performing steps A6 to A8 and then step A9 may be applied to the third manufacturing process of the second embodiment. That is, instead of steps A1 to A3, steps B1 and B2 described in the second embodiment may be performed and then steps A6 to A9 may be performed without performing steps A4 and A5.

Fourth Embodiment

Figure 16:
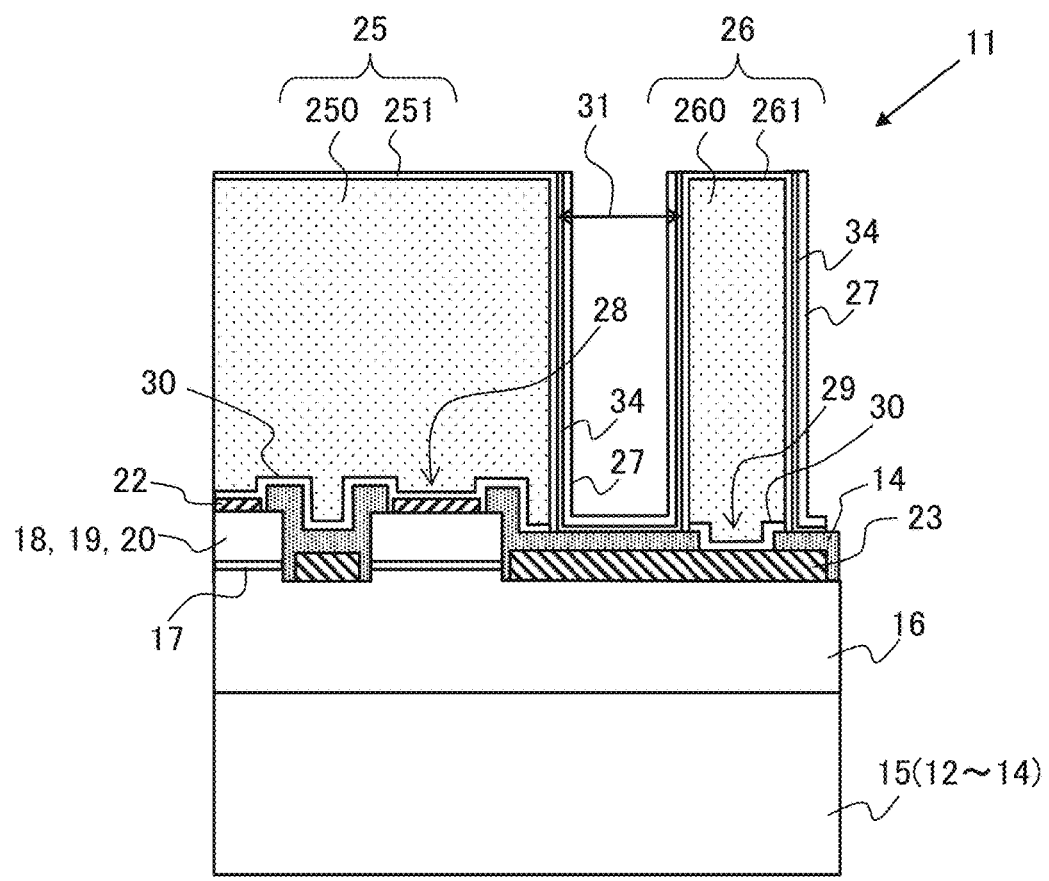
FIG. 16 is a main part cross-sectional view taken along the cross-section B-B', schematically showing the main part of the element structure of the nitride semiconductor ultraviolet light-emitting element in the fourth embodiment of the nitride semiconductor wafer according to the present invention, after the protective insulating film, the first and second plated electrodes, and the fluororesin film are formed.

Next, yet another embodiment of the present wafer 10 and the present light-emitting element 11 is described with reference to FIG. 16 as a modification of the first to third embodiments. FIG. 16 is a main-part cross-sectional view taken along a cross-section B-B', schematically showing the main part of the element structure of the present light-emitting element 11.

As shown in FIG. 16, a present wafer 10 and a present light-emitting element 11 according to a fourth embodiment have basically the same element structure as in the first embodiment. In the gap part 31 between the first plated electrode 25 and the second plated electrode 26, an opaque insulating film 34 that does not transmit ultraviolet light is provided between the fluororesin film 27 and the side surfaces of the first and second plated electrodes 25 and 26 and between the fluororesin film 27 and the protective insulating film 24 that is exposed on the bottom surface of the gap part 31.

In the present embodiment, the opaque insulating film 34 is an inorganic material film composed of GaP, GaN, GaAs, SiC, SiN, or the like, and is formed by a film forming method according to a material to be used. For example, the opaque insulating film 34 composed of GaP is formed by sputtering, and the opaque insulating film 34 composed of GaN, GaAs, SiC, SiN, or the like is formed by CVD. The film thickness of the opaque insulating film 34 is for example, approximately 300 nm, and a thick opaque insulating film 34 is preferable as a light blocking film.

In the present wafer 10 of the first to third embodiments, the protective insulating film 24 is composed of a $SiO_2$ film, an $Al_2O_3$ film, or the like that transmits ultraviolet light. A part of the ultraviolet light emitted from the active layer 17 of the present light-emitting element 11 may not be emitted from the rear surface of the substrate 12 to outside but may be reflected to the side of the semiconductor laminated portion 21, may be passed through the protective insulating film 24 exposed on the bottom surface of the gap part 31 and may be entered the gap part 31. In the present embodiment, the n-electrode 23 is disposed below the bottom surface of the gap part 31, it is thus possible to prevent ultraviolet light from passing from the n-type cladding layer 16 immediately below the gap part 31 through the protective insulating film 24 to enter the gap part 31. However, ultraviolet light that enters the protective insulating film 24 from a portion of the n-type cladding layer 16 near the boundary between the first region R1 and the second region R2 where the n-electrode 23 is not formed might pass through the protective insulating film 24 to enter the gap part 31. Consequently, as the opaque insulating film 34 is formed to cover the upper surface of the protective insulating film 24 exposed on the bottom surface of the gap part 31, it is possible to surely block the ultraviolet light that passes through the protective insulating film 24 to enter the gap part 31.

Next, a procedure of producing the opaque insulating film 34 in the manufacturing method of the present wafer 10 is described. In the manufacturing method of the present wafer 10 according to the fourth embodiment, the process of manufacturing the before-plating element structure shown in FIGS. 2 to 4 (first manufacturing process) is exactly the same as the first manufacturing process described in the first embodiment. In addition, the process of manufacturing the after-plating element structure shown in FIGS. 5 and 6 (second manufacturing process) immediately after the first and second plated electrodes 25 and 26 are formed is also exactly the same as the second manufacturing process described in the first embodiment.

In the fourth embodiment, an inorganic material film, which becomes the opaque insulating film 34, is deposited on the entire surface of the present wafer 10 having the first and second plated electrodes 25 and 26 formed thereon in the second manufacturing process. When the inorganic material film is GaP, the inorganic material film is deposited by, for example, sputtering. If the opaque insulating film 34 is deposited on the protective insulating film 24 exposed on the bottom surface of the gap part 31 between the first and second plated electrodes 25 and 26, it is possible to block the ultraviolet light that enters the gap part 31. Consequently, the opaque insulating film 34 does not need to be deposited all or a part of the side wall surfaces of the first and second plated electrodes 25 and 26. That is, the opaque insulating film 34 does not need to be formed between the fluororesin film 27 and the side wall surfaces of the first and second plated electrodes 25 and 26.

The process then proceeds to the third manufacturing process. Steps A1 to A3 described in the first embodiment or steps B1 and B2 described in the second embodiment are performed, so that the first mask material 32 is formed on the scribe region SL. In the fourth embodiment, steps A4 and A5 are not performed as in the third embodiment. That is, the second mask material 33 is not formed on the upper surfaces of the first plated electrode 25 and the second plated electrode 26 and at step A6, the coating liquid 270 is injected on the entire surface of the present wafer 10 having the first mask material 32 formed on the surface thereof. After step A6, steps A7 and A8 described in the first embodiment are performed in the same manner. As a result, the fluororesin film 27 that covers opaque insulating film 34 is formed in the element region RE other than the scribe region SL. The fluororesin film 27 and the opaque insulating film 34 formed on the upper surfaces of the first and second plated electrodes 25 and 26 are simultaneously removed by a well-known polishing method such as CMP (chemical mechanical polishing) in a manner that the outermost surfaces of the first and second surface metal films 251 and 261 are exposed and metal of the outermost layer (Au) remains on the upper surfaces of the first and second plated electrodes 25 and 26 (step C9). As a result, it is possible to form the fluororesin film 27 that does not cover the scribe region SL and the upper surfaces of the first plated electrode 25 and the second plated electrode 26 but covers the side wall surface of the first plated electrode 25, the side wall surface of the second plated electrode 26, and the exposed surface of the protective insulating film 24 exposed on the gap part 31 between the first plated electrode 25 and the second plated electrode 26. At the same time, the opaque insulating film 34 is also formed between the fluororesin film 27 and the side wall surfaces of the first and second plated electrodes 25 and 26 and between the fluororesin film 27 and the protective insulating film 24 exposed on the bottom surface of the gap part 31.

Metal of the outermost layers of the first and second surface metal films 251 and 261 is polished to a certain degree to become thin by polishing at step C9 in the fourth embodiment. Consequently, when the first and second surface metal films 251 and 261 are formed by electroless plating, the film thickness of the outermost layers is preferably larger than the film thicknesses in the first and second embodiments. Instead of setting the film thickness of the outermost layers of the first and second surface metal films 251 and 261 to be larger than those of the first and second embodiments, or in addition thereto, after polishing at step A9, metal of the outermost layer (Au) may be formed again on the exposed surfaces of the first and second surface metal films 251 and 261 by electroless plating.

While the fluororesin film 27 and the opaque insulating film 34 formed on the upper surfaces of the first and second plated electrodes 25 and 26 are simultaneously removed by the polishing process at step C9 described above, the fluororesin film 27 and the opaque insulating film 34 may be removed by photolithography and etching instead of the polishing process.

Fifth Embodiment

Next, yet another embodiment of the present wafer 10 and the present light-emitting element 11 is described as a modification of the first to third embodiments. In the present wafer 10 and the present light-emitting element 11 of the first to third embodiments, the protective insulating film 24 is composed of a $SiO_2$ film, an $Al_2O_3$ film, or the like that transmits ultraviolet light. Consequently, a part of the ultraviolet light emitted from the active layer 17 of the present light-emitting element 11 may not be emitted from the rear surface of the substrate 12 to outside but may be reflected to the side of the semiconductor laminated portion 21, may be passed through the protective insulating film 24 exposed on the bottom surface of the gap part 31 and may be entered the gap part 31. In the fourth embodiment described above, the opaque insulating film 34 that is additionally provided blocks the ultraviolet light that enters the gap part 31. In a fifth embodiment, the protective insulating film 24 is not composed of an ultraviolet transmitting material. Instead, a ultraviolet non-transmitting material that is identical to the opaque insulating film 34 described in the fourth embodiment, that is, an inorganic material film such as GaP, GaN, GaAs, SiC, SiN, or the like is formed by a well-known film forming method such as CVD or sputtering. In this case, the protective insulating film 24 is formed to have a film thickness of approximately 100 nm to 1 μm, preferably 150 nm to 350 nm as in the first embodiment. However, if the film thickness is reduced, a material used for the protective insulating film 24, for example, SiN may transmit ultraviolet light and thus may be semitransparent to ultraviolet light. It is thus preferable to adjust the film thickness depending on the emission wavelength.

The protective insulating film 24 is composed of a material that does not transmit ultraviolet light in the fifth embodiment, and thus it is possible to prevent the ultraviolet light emitted from the active layer 17 of the present light-emitting element 11 from passing through the protective insulating film 24 and entering the gap part 31. Consequently, it is not necessary to additionally form the opaque insulating film 34 described in the fourth embodiment on the bottom surface of the gap part 31.

Sixth Embodiment

Next, yet another embodiment of the present wafer 10 and the present light-emitting element 11 is described with reference to FIG. 17 as a modification of the first to fifth embodiments. In the present wafer 10 and the present light-emitting element 11 of the first to fifth embodiments, the first mask material 32 is formed on the scribe region SL and the side region thereof or on the scribe region SL so that the fluororesin film 27 is not formed on the scribe region SL and the side region thereof or on the scribe region SL. Consequently, when the present wafer 10 is cut or divided along the scribe regions SL, it is possible to prevent in advance an outer circumferential end of the fluororesin film 27 from being damaged and peeled at an outer circumferential end part of the present light-emitting element 11 divided into element units.

In the sixth embodiment, the first mask material 32 is not formed on the scribe region SL and the side region thereof or on the scribe region SL. That is, steps A1 to A3 or steps B1 and B2 in the third manufacturing process are not performed. Instead, a second fluororesin film 35 that is composed of the second type amorphous fluororesin with higher bondability to metal than the fluororesin film 27 that uses the first type amorphous fluororesin or that mainly contains the second type amorphous fluororesin is formed, as a primer film of the fluororesin film 27, on the scribe region SL and the side region thereof by, for example, an ink-jet system (step D1). Steps A4 to A8 in the third manufacturing process are then performed. In the sixth embodiment, when steps A4 and A5 are not performed, it is not necessary to perform the process of dissolving the first mask material 32 and the second mask material 33 at step A8, and step A9 or C9 is performed. It is not necessary to set the film thickness of the second fluororesin film 35 to be unnecessarily thick. The film thickness of the second fluororesin film 35 may be less than the film thickness of the fluororesin film 27, for example, may be equal to the thickness of a single-layer molecular layer, which is preferably approximately 0.01 to 0.5 μm.

Figure 17:
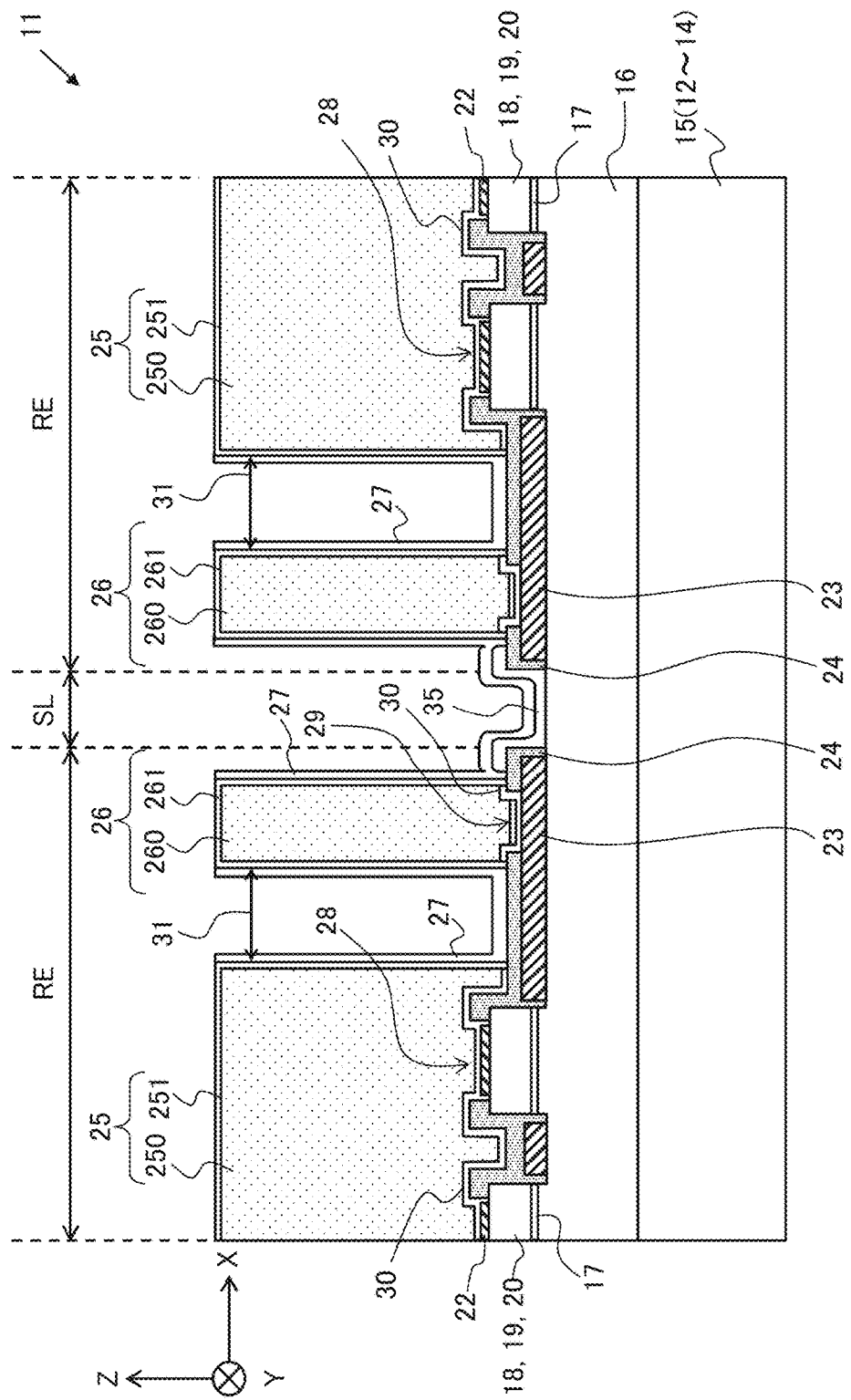
FIG. 17 is a main part cross-sectional view taken along the cross-section B-B', schematically showing the main part of the element structure of the nitride semiconductor ultraviolet light-emitting element in the sixth embodiment of the nitride semiconductor wafer according to the present invention, after the protective insulating film, the first and second plated electrodes, and the fluororesin film are formed.

As a result, in the sixth embodiment, the fluororesin film 27 is also formed on the scribe region SL and the side region thereof with the second fluororesin film 35 interposed therebetween, as shown in FIG. 17. When the present wafer 10 is cut or divided along the scribe regions SL, if an outer circumferential end of the fluororesin film 27 is damaged at an outer circumferential end part of the present light-emitting element 11 divided into element units, the second fluororesin film 35 functions as a binder and can prevent the outer circumferential end of the fluororesin film 27 from being peeled at the outer circumferential end of the present wafer 10. If the second fluororesin film 35 is formed on the side region of the scribe region SL, peeling is prevented. The side region of the scribe region SL on which the second fluororesin film 35 is formed is not limited to the region between the outer circumferential line of the n-electrode 23 and the scribe region SL, which is described in the second embodiment, and may be extended to the inside of the outer circumferential line of the n-electrode 23.

In the sixth embodiment, steps A1 to A3 or steps B1 and B2 in the third manufacturing process are not performed basically. However, steps A1 to A3 or steps B1 and B2 may be performed and then at least the first mask material 32 is dissolved and removed at step A8 in a manner that the fluororesin film 27 is not formed on the scribe region SL and the side region thereof or on the scribe region SL.

Seventh Embodiment

Next, a present light-emitting device 50 obtained by mounting the present light-emitting element 11 in a chip state on a submount 40, which is a base for flip-chip mounting, by a flip-chip mounting method is described with reference to FIGS. 18 to 20.

FIG. 18 is a schematic cross-sectional view of a configuration example of the present light-emitting device 50. In FIG. 18, the present light-emitting element 11 is mounted on the submount 40 upside down. That is, the present light-emitting element 11 is mounted on the submount 40 in a manner that the upper surfaces of the first and second plated electrodes 25 and 26 face downward. The present light-emitting element 11 has the element structure described in the first to fourth embodiments. The present light-emitting element 11 that is diced into a chip is used. FIG. 18 shows, as an example, a cross-sectional structure (a cross-section that is parallel to an XZ plane along the line B-B' in the planar view of FIG. 9) when the present light-emitting element 11 described in the first embodiment is used. XYZ coordinate axes shown in FIG. 18 and FIGS. 19 and 20 to be described later are shown with reference to the present light-emitting element 11, and thus a +Z direction is a downward direction in these figures.

Figure 19A:
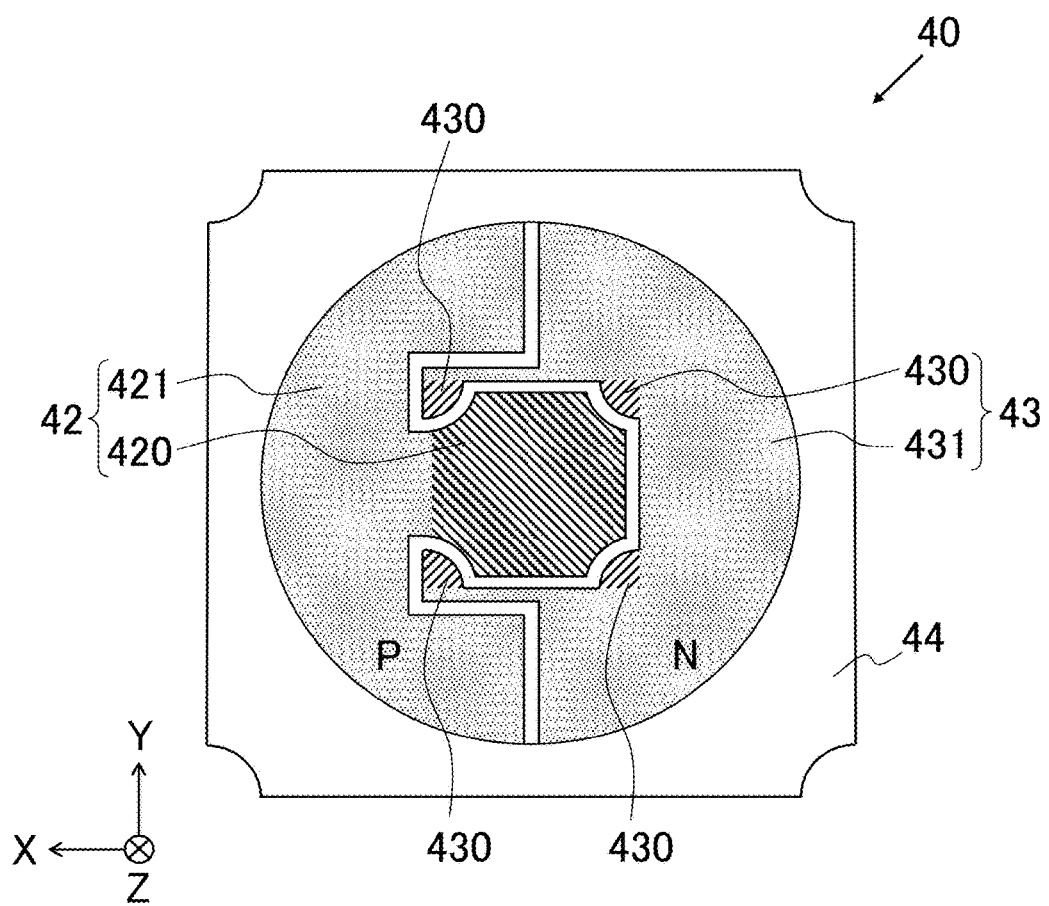
FIG. 19A is a plan view schematically showing the planar view shape of a submount used in the nitride semiconductor ultraviolet light-emitting device shown in FIG. 18.
Figure 19B:
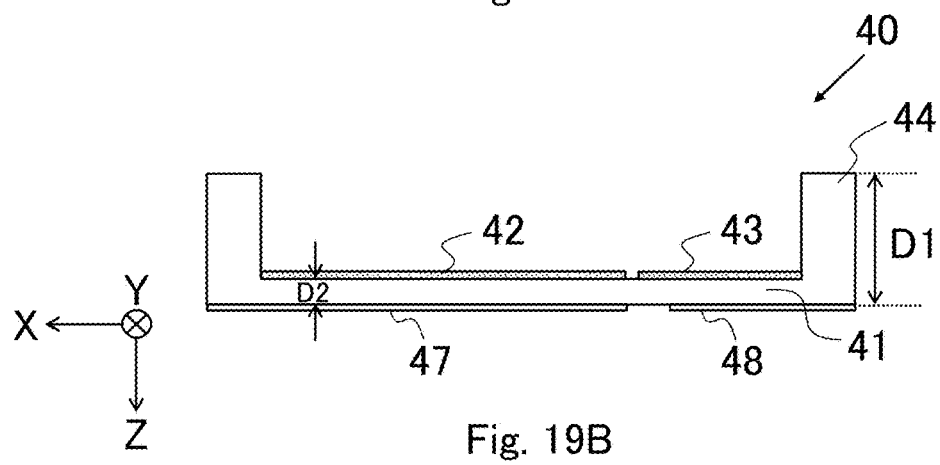
FIG. 19B is a cross-sectional view schematically showing the cross-sectional shape of the submount used in the nitride semiconductor ultraviolet light-emitting device shown in FIG. 18.
Figure 20:
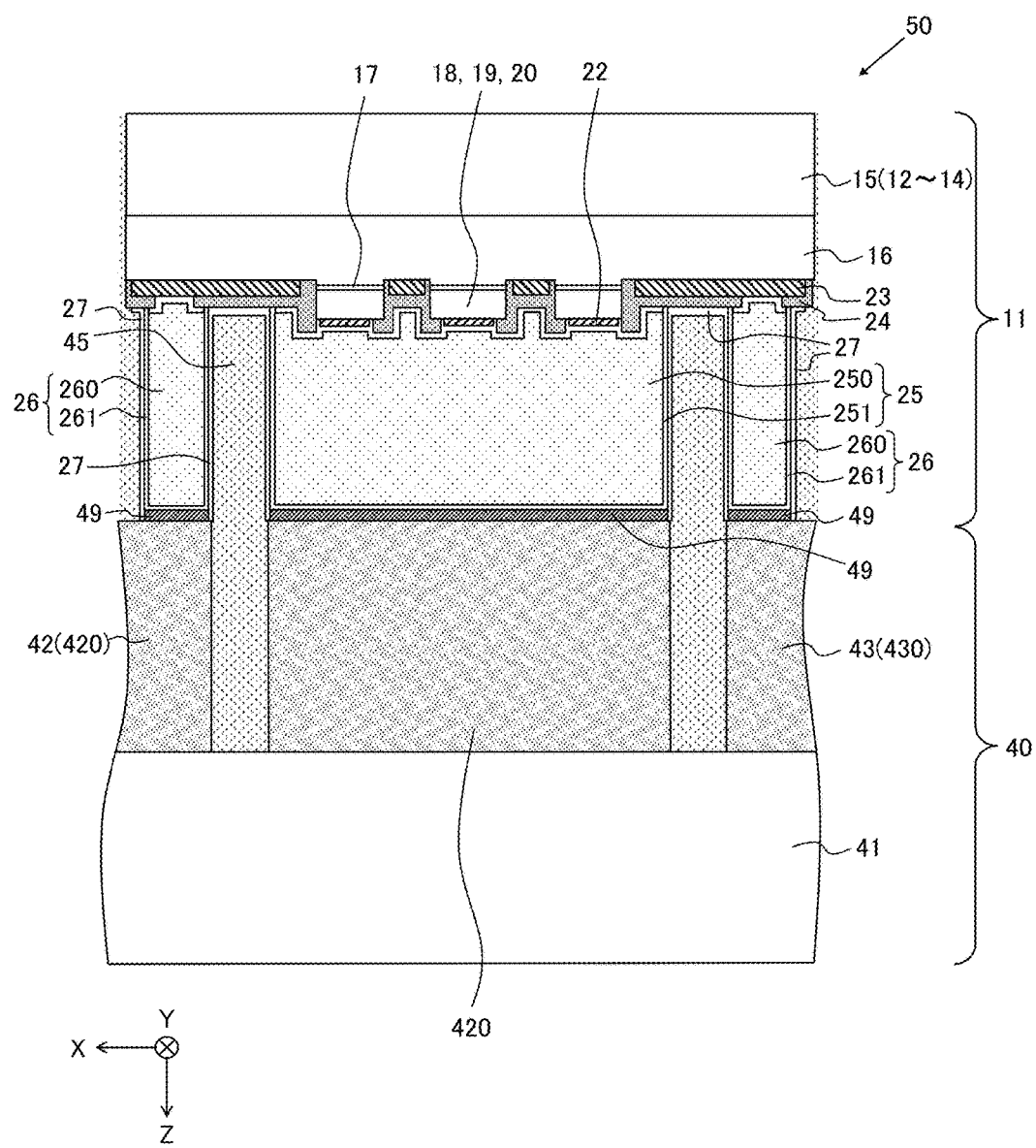
FIG. 20 is a cross-sectional view schematically showing the structure of the main part of the nitride semiconductor ultraviolet light-emitting device shown in FIG. 18.

FIG. 19A is a plan view showing a planar view shape of the submount 40. FIG. 19B is a cross-sectional view showing a cross-sectional shape of a cross-section that is parallel to an XZ plane passing the center of the submount 40 in the plan view of FIG. 19A. The submount 40 is obtained by forming a first metal electrode wire 42, which is an anode, and a second metal electrode wire 43, which is a cathode, on a part of a surface of a base material 41 composed of an insulating material such as an insulating ceramic. It is configured in a manner that a thickness D1 of a side wall 44 of the base material 41 is larger than a thickness D2 of a center part inside the side wall 44, and a sealing resin 45 that seals the present light-emitting element 11 can be accommodated in the space surrounded by the side wall 44. In addition, a collecting lens 46 that is composed of an amorphous fluororesin that is the same as the semi-spherical sealing resin 45 to be described later that transmits ultraviolet light emitted from the present light-emitting element 11 is fixed on an upper surface of the side wall 44. As the sealing resin 45 is covered by the lens 46, the sealing resin 45 is fixed in the space surrounded by the side wall 44. It is only required that ultraviolet transmission characteristics of the sealing resin 45 and the lens 46 are suitable for the light emission wavelength of the present light-emitting element 11 to be used.

The first and second metal electrode wires 42 and 43 are connected via penetration electrodes (not shown) formed in the base material 41 to lead terminals 47 and 48 on the rear surface of the base material 41. When the submount 40 is mounted on other printed wiring boards or the like, metal wires on the printed wiring boards are electrically connected to the lead terminals 47 and 48. In addition, the lead terminals 47 and 48 cover the substantially entire rear surface of the base material 41 to function as a heat sink. In the present embodiment, the base material 41 of the submount 40 is composed of an insulating material such as aluminum nitride (AlN). While the base material 41 is preferably composed of AlN in view of heat dissipation, the base material 41 may be composed of silicon carbide (SiC), silicon nitride (SiN), or boron nitride (BN), or may be ceramics such as alumina ($Al_2O_3$). In addition, the base material 41 may be composed of not only a solid insulating material but also a sintered body obtained by tightly bonding particles of the insulating material using silica glass as a binder. Moreover, the base material 41 may be composed of a diamond-like carbon (DLC) thin film, an industrial diamond thin film, or the like. As an example, the first and second metal electrode wires 42 and 43 are constituted by a thick copper-plated film and a single-layer or multi-layer surface metal film that covers the surface (an upper surface and a side wall surface) of the thick plated film. The outermost layer of the surface metal film is composed of a metal having smaller ionization tendency than copper composing the thick plated film (for example, gold (Au), platinum group metals (Ru, Rh, Pd, Os, Ir, Pt, or two or more alloys thereof), or alloys of gold and platinum group metals). As an example, the surface metal film is composed of three-layer metal films of Ni/Pd/Au in this order from the bottom and is formed by a well-known electroless plating, which is a wet plating method. The film thickness of the thick copper-plated film is, for example, approximately 50 to 100 μm. The film thicknesses of the Ni/Pd/Au layers are, for example, 3 to 7.5 μm/50 to 150 nm/50 to 150 nm in this order from the bottom. In the above example, the first and second metal electrode wires 42 and 43 have the same structure (a multi-layer structure) as the first and second plated electrodes 25 and 26 of the present light-emitting element 11 other than the planar view shape thereof. When the upper surfaces of the first and second metal electrode wires 42 and 43 are polished after the surface metal film is formed, the film thickness of the outermost layer of the surface metal film may be larger than the film thickness exemplified above.

When the lead terminals 47 and 48 are not provided on the rear surface of the base material 41 in the submount 40, the base material 41 does not need to be composed of only the insulating material, and may have a laminated structure of a metal film (for example, Cu and Al) and an insulating layer composed of the above insulating material.

The fluororesin lens 46 is formed by, for example, injection molding, transfer molding, compression molding, or the like. A metal mold, a silicone resin mold, or combinations thereof may be used for a mold for the moldings. The base material 41 may be a plate that does not include the side wall 44 and has a uniform thickness. In this case, the sealing resin 45 may be formed in a lens shape, instead of forming the lens 46. For example, a second sealing resin film that is formed at step E3 in a method of producing the present light-emitting device 50 to be described later may be formed in a lens shape. The lens 46 does not need to be composed of a fluororesin and may be composed of other materials with ultraviolet transmission characteristics suitable for the light emission wavelength of the present light-emitting element 11. Although the lens 46 is preferably composed of a material with a small refractive index difference between the material and the sealing resin 45, a quartz glass lens might be used. The lens 46 may be, in addition to a collecting lens, a lens that diffuses light depending on intended use, and the lens 46 does not need to be necessarily provided.

As shown in FIGS. 19A and 19B, the first and second metal electrode wires 42 and 43 are formed to be exposed on the surface of the center part of the base material 41 surrounded by the side wall 44, are disposed to be spaced apart from each other, and are electrically separated from each other. The first metal electrode wire 42 is constituted by a first electrode pad 420 and a first wire part 421 connected to the first electrode pad 420. The second metal electrode wire 43 is constituted by four second electrode pads 430 and a second wire part 431 connected to the second electrode pads 430. The first electrode pad 420 has a planar view shape that is slightly larger than the planar view shape of the first plated electrode 25 of the present light-emitting element 11 and is disposed at the center of the center part of the base material 41. The planar view shape of the second electrode pads 430 and the arrangement thereof are set in a manner that when the present light-emitting element 11 is disposed so that the first plated electrode 25 opposes the first electrode pad 420, the four second plated electrodes 26 oppose the four second electrode pads 430, respectively. In FIG. 19A, the first electrode pad 420 and the second electrode pad 430 are hatched.

In the present light-emitting element 11, the upper surfaces of the first and second plated electrodes 25 and 26 face downward, the first plated electrode 25 and the first electrode pad 420 are opposed and electrically and physically connected to each other by soldering, and the four second plated electrodes 26 and the four second electrode pads 430 are opposed, respectively, and electrically and physically connected to each other by soldering. In this way, the present light-emitting element 11 is mounted on the center part of the base material 41 and fixed thereon. In the present embodiment, the present light-emitting element 11 is flip-chip mounted on the submount 40.

In the present embodiment, the first type amorphous fluororesin that has high thermal resistance, high ultraviolet resistance, and high ultraviolet transmission characteristics and that is the same as that used for the fluororesin film 27 of the present wafer 10 is used as the sealing resin 45.

When the first type amorphous fluororesin is used as the sealing resin 45, the first type amorphous fluororesin has non-reactive functional groups including a terminal functional group that is not bondable to metal, and thus bonding of the first type amorphous fluororesin to the surface of the base material 41 or the rear surface of the substrate 12 of the present light-emitting element 11 might be lower than that of a bonding fluororesin that has reactive functional groups including a terminal functional group bondable to metal. Consequently, to increase the bondability of the first type amorphous fluororesin, the submount 40 is used in which the surface of the base material 41 is a rough surface that has recesses and projections of, for example, approximately 6 μm at a maximum. The rough surface of the base material 41 may be formed by performing a roughening process employing, for example, nanoimprinting. Alternatively, if the surface of the base material 41 is unpolished and thus recesses and projections of, for example, approximately 6 μm at a maximum remain thereon, such a rough surface may be used as it is. The sealing resin 45 even enters a gap between the present light-emitting element 11 and the submount 40 and is filled in the gap. The filled gap functions as an anchor and thus if the sealing resin 45 is peeled off the surface of the base material 41 or the rear surface of the substrate 12, the sealing resin 45 is not removed from the present light-emitting element 11.

Next, the outline of a method of producing the present light-emitting device 50 is briefly described with reference to FIG. 20. FIG. 20 is a main-part cross-sectional view schematically showing a portion in which the first and second plated electrodes 25 and 26 are connected to the first and second metal electrode wires 42 and 43 by solders 49 in the light-emitting device 50 shown in FIG. 18 (a part of a cross-section parallel to an XZ plane along the line B-B' of FIG. 9).

A diced bare chip of the present light-emitting element 11 is fixed on the first and second metal electrode wires 42 and 43 of the submount 40 by well-known flip-chip mounting. Specifically, the first plated electrode 25 is physically and electrically connected via the solder 49 to the first metal electrode wire 42, and the second plated electrodes 26 are physically and electrically connected via the solder 49 to the second metal electrode wire 43 (step E1). The p-electrode 22 of the present light-emitting element 11 is thus electrically connected to the first metal electrode wire 42, and the n-electrode 23 of the present light-emitting element 11 is thus electrically connected to the second metal electrode wire 43. Soldering is performed by a well-known soldering method such as a reflow method, and a detailed description thereof is omitted.

Next, a coating liquid prepared by dissolving the first type amorphous fluororesin in a fluorine-containing solvent, preferably an aprotic fluorine-containing solvent is injected in the space surrounded by the side wall 44 of the submount 40 using a highly strippable Teflon needle or the like, and the coating liquid is then gradually heated to evaporate the solvent. As a result, a first sealing resin film composed of a non-bonding amorphous fluororesin is formed on an inner wall surface of the side wall 44 of the submount 40, upper surfaces of the first and second metal electrode wires 42 and 43, an exposed surface of the base material 41 between the first and the second metal electrodes wires 42 and 43, upper and side surfaces of the present light-emitting element 11, and in the gap between the present light-emitting element 11 and an upper surface of the submount 40 (step E2). When the solvent is evaporated at step E2, the solvent is gradually heated from a low-temperature range equal to or lower than the boiling temperature of the solvent (for example, approximately a room temperature) to a high-temperature range equal to or higher than the boiling point of the solvent (for example, near 200° C.) to be evaporated so that air bubbles do not remain in the first sealing resin film.

Next, a solid non-bonding amorphous fluororesin is put into an inside and an upper space of the first sealing resin film formed in the space surrounded by the side wall 44 of the submount 40 at step E2, the non-bonding amorphous fluororesin is melted at a high temperature of, for example, 250° C. to 300° C., and then gradually cooled down, so that a second sealing resin film is formed (step E3).

Finally, the lens 46 is fixed on the upper surface of the side wall 44 (step E4), so that the light-emitting device 50 shown in FIG. 18 is produced. In the production method described above, the sealing resin 45 is constituted by the first and second sealing resin films. For example, as disclosed in Patent Document 1, the lens 46 is fixed on the upper surface of the side wall 44 by an adhesive or by fitting structures provided in the lens 46 and the side wall 44. The methods of forming the sealing resin 45 and fixing the lens 46 are not limited to the methods described above. The lens 46 does not need to be necessarily provided.

Eighth Embodiment

Figure 21:
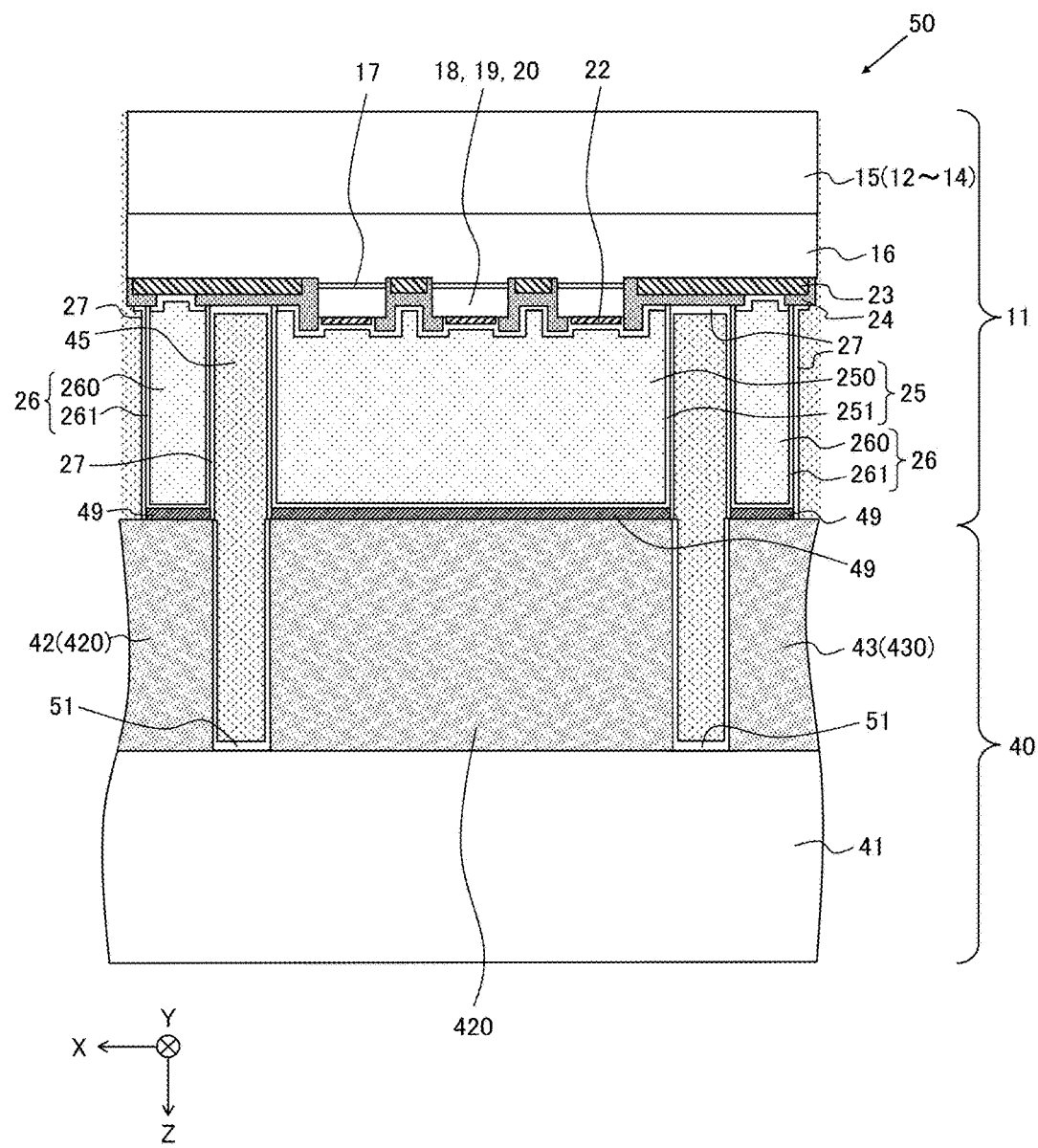
FIG. 21 is a cross-sectional view schematically showing the structure of the main part of another configuration example of the nitride semiconductor ultraviolet light-emitting device according to the present invention.

Next, another embodiment of the present light-emitting device 50 is described with reference to FIG. 21 as a modification of the seventh embodiment. In a present light-emitting device 50 according to an eighth embodiment, a present light-emitting element 11 is the same as the present light-emitting element 11 used in the seventh embodiment. The present light-emitting device 50 of the eighth embodiment is different from the present light-emitting device 50 of the seventh embodiment in the submount 40. FIG. 21 corresponds to FIG. 20 of the seventh embodiment, and is a main-part cross-sectional view schematically showing a portion in which the first and second plated electrodes 25 and 26 are connected to the first and second metal electrode wires 42 and 43 by the solders 49 in the light-emitting device 50 (a part of a cross-section parallel to an XZ plane along the line B-B' of FIG. 9).

In the eighth embodiment, as shown in FIG. 21, a fluororesin film 51 that is identical to the fluororesin film 27 provided in the present light-emitting element 11 is formed also in the submount 40 to cover side wall surfaces of the first and second metal electrode wires 42 and 43 and a surface of the base material 41 exposed on a bottom surface of a gap part between the first and second metal electrode wires 42 and 43.

In the eighth embodiment, the fluororesin film 51 is composed of, as an example, the first type amorphous fluororesin described in the first embodiment, similarly to the fluororesin film 27.

The fluororesin film 51 is formed by injecting the same coating liquid as the coating liquid 270 used for forming the fluororesin film 27, which is described in the first embodiment, in a trench in the gap part between the first and second metal electrode wires 42 and 43 by an ink-jet system, a dispenser, or potting. The concentration of a fluororesin in the coating liquid is adjusted according on the film thickness of the fluororesin film 51. At this time, it is necessary to prevent the coating liquid from overflowing from the trench and being adhered to the upper surfaces of the first and second electrode pads 420 and 430. To prevent the coating liquid from being adhered to the upper surfaces of the first and second electrode pads 420 and 430, the second mask material 33 that is applied on the upper surfaces of the first and second plated electrodes 25 and 26 in the third manufacturing process of the first embodiment may be applied in advance on at least the upper surfaces of the first and second electrode pads 420 and 430 by a printing method such as a transfer system or an ink-jet system, and then the coating liquid may be injected in the trench. In this case, by dissolving the second mask material 33 with an organic solvent to be removed, the fluororesin film 51 formed on the second mask material 33 is simultaneously removed. The coating liquid injected in the trench is gradually heated to evaporate the solvent in the same manner as in the third manufacturing process of the first embodiment, so that the fluororesin film 51 is formed.

It is only required that the fluororesin film 51 is formed to continuously cover the side wall surfaces of the first and second metal electrode wires 42 and 43 upward from the boundary line between the side wall surface and the bottom surface of the gap part (that is, a lower end of the side wall surface). An upper end part of the side wall surface might be exposed during a step of drying the coating liquid, or if a part of the upper end part is covered by the second mask material 33 and then after the second mask material 33 is removed, the upper end of the side wall surface might be exposed. A portion of the surface of the base material 41 exposed on the bottom surface of the gap part between the first and second metal electrode wires 42 and 43 does not need to be necessarily covered by the fluororesin film 51, if the portion is far away from the first and second electrode pads 420 and 430 and is unlikely adhered to a solder.

Other Embodiments

Modifications of the first to eighth embodiments are described below.

(1) The first to sixth embodiments have described a case where the fluororesin film 27 is composed of the same amorphous fluororesin as that used for sealing when flip-chip mounting the present light-emitting element 11. However, in a rear-surface output type light-emitting element that outputs ultraviolet light emission from the rear surface of the substrate, 12, the gap part 31 between the first and second plated electrodes 25 and 26 is not disposed on a light extraction path, and thus the fluororesin film 27 does not need to be composed of an amorphous fluororesin that transmits ultraviolet light. That is, the fluororesin film 27 may be composed of a fluororesin that contains a crystalline part with ultraviolet resistance as the amorphous fluororesin has.

(2) The first to sixth embodiments have described a case where a non-bonding fluororesin (first type amorphous fluororesin) that has non-reactive functional groups including a terminal functional group that is not bondable to metal is used as the fluororesin film 27. However, a bonding fluororesin (second type amorphous fluororesin) that has reactive functional groups including a terminal functional group bondable to metal may be partially used as the fluororesin film 27.

In this case, the second type amorphous fluororesin has higher bondability to a metal surface than the first type amorphous fluororesin. Consequently, it is preferable to configure in a manner that the fluororesin film 27 has a two-layer structure of the second type amorphous fluororesin and the first type amorphous fluororesin, an extremely thin second type amorphous fluororesin film is formed as a first layer that directly contacts the side wall surfaces of the first and second plated electrodes 25 and 26, and a first type amorphous fluororesin film is then formed on the first layer. In this case, it is only required that the total film thickness of the first layer and the second layer is equal to the film thickness of the fluororesin film 27 exemplified in the first to sixth embodiments, and that the film thickness of the first layer is equal to or larger than the thickness of a few atomic layers. The first and second amorphous fluororesin film layers are formed as follows. That is, steps A6 and A7 in the third manufacturing process described in the first embodiment are repeated twice, that is, for the second type amorphous fluororesin film and the first type amorphous fluororesin film, and then step A8 is performed. At step A6, which is performed for the second time, the base resin film 271 of the first layer formed at step A7, which is performed for the first time, might be partially dissolved to become thin. Consequently, it is preferable to form the base resin film 271 of the first layer to be thick so as not to be completely dissolved.

(3) The first to sixth embodiments have described the planar view shape of the present light-emitting element 11 in which a first region is surrounded by a second region. However, the first region may be divided into a plurality of sub-regions and the respective sub-regions may be surrounded by the second region. That is, a plurality of mesas may be present within an element region RE and the first plated electrode 25 may be formed on each of the mesas. Alternatively, a first plated electrode 25 may be formed to cover the plurality of mesas.

(4) In the first to sixth embodiments, the polishing process of removing and planarizing recesses and projections on the upper surfaces of the first and second main body electrodes 250 and 260 for leveling the upper surfaces is performed in the second manufacturing process in the manufacturing method of the present wafer 10. However, if the recesses and projections on the upper surfaces or the difference in height between the first and second main body electrodes 250 and 260 do not hinder film forming of the first and second surface metal films 251 and 261 by an electroless plating method before polishing the first and second main body electrodes 250 and 260, soldering when flip-chip mounting the present light-emitting element 11, and the like, the polishing process may be omitted.

(5) While the seventh and eighth embodiments have described the present light-emitting device 50 in which one present light-emitting element 11 is mounted on the submount 40, the present light-emitting device may be configured by mounting a plurality of the present light-emitting elements 11 on a submount or a base such as a COB (chip on board) wiring board. In this case, the present light-emitting elements 11 may be sealed by the sealing resin 45, or may be separately sealed. In this case, for example, a resin dam that surrounds one or a plurality of the present light-emitting elements 11, functioning as the sealed unit, is formed in advance on a surface of the base, and the sealing resin 45 is then formed in the region surrounded by the resin dam in the same manner as in the seventh embodiment.

In the present light-emitting element 11, the upper surfaces of the first and second plated electrodes 25 and 26 can be planarized so as to have the same height. Thus the present light-emitting element 11 can be directly mounted on a COB wiring board or the like by soldering, like other surface mount electronic devices or electrical elements (a resistance element, a capacitor, a diode, a transistor, and the like). Therefore, a plurality of the present light-emitting elements 11 can be mounted on a base. In addition, the present light-emitting elements 11 can be mounted on the same base together with other surface mount electronic devices or electrical elements. The base on which the present light-emitting element 11 is mounted is not limited to a submount and a COB wiring board.

(6) The present light-emitting element 11 includes the first and second plated electrodes 25 and 26 and the fluororesin film 27, and thus it is possible to prevent degradation of electrical characteristics caused by a sealing resin filled between electrodes in an ultraviolet light-emitting operation.

The before-plating element structure of the present light-emitting element 11 is not limited to the before-plating element structure that is shown by FIGS. 2 to 4 and is constituted by the laminate structure, material, film thickness, AlN molar fraction, and the like described in the first embodiment, and various modifications can be made to the before-plating element structure. For example, while the template 15 shown in FIG. 4 is described, a template used in the present invention is not limited to the template 15, and the AlN layer 13 may be an ELO-AlN layer formed by an epitaxial lateral overgrowth method, the AlGaN layer 14 may be omitted, and other substrates may be used instead of the sapphire substrate 12. In addition, the film thickness and AlN molar fraction of an AlGaN layer or a GaN layer composing the present light-emitting element 11 described in the above embodiments are only an example, and may be appropriately changed according to specification of elements. While the embodiments described above have described a case where the electron blocking layer 18 is formed, the electron blocking layer 18 may not be necessarily provided.

It is assumed that the before-plating element structure of the present light-emitting element 11 has an emission center wavelength of 365 nm or less. Consequently, the before-plating element structure of the present light-emitting element 11 is configured to include at least a semiconductor laminated portion constituted by laminating a first semiconductor layer constituted by one or a plurality of n-type AlGaN semiconductor layers, an active layer constituted by one or a plurality of AlGaN semiconductor layers having an AlN molar fraction of 0 or more, and a second semiconductor layer constituted by one or a plurality of p-type AlGaN semiconductor layers, an n-electrode constituted by one or a plurality of metal layers, and a p-electrode constituted by one or a plurality of metal layers.

(7) In the eighth embodiment, the fluororesin film 51 is composed of the same amorphous fluororesin as that used for the sealing resin like the fluororesin film 27 of the first to sixth embodiments. In addition, a non-bonding fluororesin (first type amorphous fluororesin) that has non-reactive functional groups including a terminal functional group that is not bondable to metal is used for the fluororesin film 51. However, other implementations of the fluororesin film 51 are also possible, which are the same as other implementations of the fluororesin film 27 described in (1) and (2) in <Other Embodiments> section.

INDUSTRIAL APPLICABILITY

A nitride semiconductor wafer and the like according to the present invention can be used for a light emission diode having an emission center wavelength of approximately 365 nm or less, and is effective for preventing degradation of electrical characteristics caused by a sealing resin filled between electrodes in ultraviolet light-emitting operation.

DESCRIPTION OF SYMBOLS 10 nitride semiconductor wafer
11 nitride semiconductor ultraviolet light-emitting element
12 sapphire substrate
13 AlN layer
14 AlGaN layer
15 template
16 n-type cladding layer (n-type AlGaN)
17 active layer
170 barrier layer
171 well layer
18 electron blocking layer (p-type AlGaN)
19 p-type cladding layer (p-type AlGaN)
20 p-contact layer (p-type GaN)
21 semiconductor laminated portion
22 p-electrode
23 n-electrode
24 protective insulating film
25 first plated electrode
250 first main body electrode
251 first surface metal film
26 second plated electrode
260 second main body electrode
261 second surface metal film
27 fluororesin film
270 coating liquid
271 base resin film
28 first opening
29 second opening
30 seed film
31 gap part between first plated electrode and second plated electrode
32 first mask material (photoresist layer)
33 second mask material
34 opaque insulating film
35 second fluororesin film
40 submount
41 base material
42 first metal electrode wire
420 first electrode pad 421 first wire part
43 second metal electrode wire
430 second electrode pad
431 second wire part
44 side wall
45 sealing resin
46 lens
47, 48 lead terminal
49 solder
50 nitride semiconductor ultraviolet light-emitting device
51 fluororesin film
BL boundary line between first region and second region
C boundary between recess part region and surrounding region
R1 first region
R2 second region
R3 recessed region
R4 surrounding region

The invention claimed is:

1. A nitride semiconductor wafer that is formed by arranging a plurality of element units on a substrate in a matrix, wherein
each of the element units is a nitride semiconductor ultraviolet light-emitting element that includes a semiconductor laminated portion constituted by laminating a first semiconductor layer including an n-type AlGaN semiconductor layer, an active layer including an AlGaN semiconductor layer, and a second semiconductor layer including a p-type AlGaN semiconductor layer, an n-electrode constituted by one or more metal layers, a p-electrode constituted by one or more metal layers, a protective insulating film, a first plated electrode that contacts an exposed surface of the p-electrode that is not covered by the protective insulating film, a second plated electrode that contacts an exposed surface of the n-electrode that is not covered by the protective insulating film, and a fluororesin film,
in each of the element units,
when it is assumed that a region occupied by one element unit in a plane parallel to a surface of the semiconductor laminated portion is an element region, the semiconductor laminated portion is formed so as to laminate the active layer and the second semiconductor layer on the first semiconductor layer in a first region that is a part of the element region and to expose the first semiconductor layer in a second region other than the first region in the element region,
the n-electrode is formed on an exposed surface of the first semiconductor layer in the second region,
the p-electrode is formed on a uppermost surface of the second semiconductor layer,
the protective insulating film is formed to cover at least an entire outer circumferential side surface of the semiconductor laminated portion in the first region, an upper surface of the first semiconductor layer between the first region and the n-electrode, and upper and side surfaces of the n-electrode including at least a portion of an outer circumferential edge part of the n-electrode opposing the first region and not to cover but to expose at least a part of a surface of the n-electrode and at least a part of a surface of the p-electrode,
each of the first plated electrode and the second plated electrode is constituted by a main body electrode composed of copper or an alloy containing copper as a main component and a single-layer or multi-layer surface metal film in which an outermost layer covering an upper surface and a side wall surface of the main body electrode is composed of gold or a platinum group metal,
the first plated electrode is formed to be spaced apart from the second plated electrode and to cover an entire upper surface of the first region including an exposed surface of the p-electrode, an entire outer circumferential side surface of the first region covered by the protective insulating film, and a boundary region that is a part of the second region and contacts the first region, and wherein
the fluororesin film continuously covers at least a part of a side wall surface of the first plated electrode other than an upper end part, a part of a side wall surface of the second plated electrode other than an upper end part, and a part of an exposed surface of the protective insulating film exposed on a gap part between the first plated electrode and the second plated electrode other than an outer circumferential end.

2. The nitride semiconductor wafer according to claim 1, wherein the fluororesin film is not formed in a chip cutting region between the element regions where the plurality of element units are adjacent to each other.

3. The nitride semiconductor wafer according to claim 1, wherein the fluororesin film is not formed on an upper surface of the first plated electrode and an upper surface of the second plated electrode.

4. The nitride semiconductor wafer according to claim 1, wherein surfaces of the first plated electrode and the second plated electrode are planarized and heights of the surfaces in a direction vertical to a surface of the semiconductor laminated portion are aligned with each other.

5. The nitride semiconductor wafer according to claim 1, wherein an entire outer circumference of the first plated electrode is disposed on the n-electrode with the protective insulating film interposed therebetween.

6. The nitride semiconductor wafer according to claim 1, wherein a spaced distance between the first plated electrode and the second plated electrode is equal to or larger than 75 µm.

7. The nitride semiconductor wafer according to claim 1, wherein the fluororesin film includes an amorphous fluororesin composed of a polymer or a copolymer having a fluorine-containing aliphatic cyclic structure as a structural unit.

8. The nitride semiconductor wafer according to claim 1, wherein the fluororesin film includes a first type fluororesin where a terminal functional group of a polymer or a copolymer composing a fluororesin is a non-reactive terminal functional group that is not bondable to metal.

9. The nitride semiconductor wafer according to claim 1, wherein the fluororesin film is constituted by a laminated film of two or more layers, a resin film of a first layer of the laminated film that contacts the first plated electrode and the second plated electrode includes a second type fluororesin where a terminal functional group of a polymer or a copolymer composing a fluororesin is a reactive terminal functional group bondable to metal, and a resin film of each of second and subsequent layers of the laminated film includes a first type fluororesin where a terminal functional group of a polymer or a copolymer composing a fluororesin is a non-reactive terminal functional group that is not bondable to metal.

10. The nitride semiconductor wafer according to claim 1, wherein a second fluororesin film that includes a second type fluororesin where a terminal functional group of a polymer or a copolymer composing a fluororesin is a reactive terminal functional group bondable to metal is formed as a primer film of the fluororesin film on a chip cutting region between the element regions where the plurality of element units are adjacent to each other and a side region of the chip cutting region or on the side region of the chip cutting region.

11. The nitride semiconductor wafer according to claim 1 further comprising an inorganic material film that does not transmit ultraviolet light between the protective insulating film on a bottom surface of the gap part between the first plated electrode and the second plated electrode and the fluororesin film.

12. A nitride semiconductor ultraviolet light-emitting element formed by dividing the nitride semiconductor wafer according to claim 1 into each of the element units.

13. A nitride semiconductor ultraviolet light-emitting device that is formed by flip-chip mounting at least one nitride semiconductor ultraviolet light-emitting element according to claim 12 on a base for flip-chip mounting, wherein
the base is constituted by an insulating base material and two or more metal films electrically separated from each other that are formed on a surface of the insulating base material with an upper surface and a side wall surface covered by gold or a platinum group metal,
the two or more metal films are formed in a predetermined planar view shape that is capable of mounting at least one nitride semiconductor light-emitting element thereon and includes two or more electrode pads as a whole,
along a boundary line between an exposed surface of the insulating base material that is not covered by the two or more metal films and a side wall surface of the metal film, at least a part of the exposed surface of the insulating base material that is continuous with the boundary line and a part of the side wall surface of the metal film that is continuous with the boundary line are covered by a fluororesin, and wherein
at least parts of an upper surface of the metal film composing the two or more electrode pads are not covered by the fluororesin.

14. A manufacturing method of a nitride semiconductor wafer, the nitride semiconductor wafer being formed by arranging a plurality of element units on a substrate in a matrix, wherein
each of the element units is a nitride semiconductor ultraviolet light-emitting element that includes a semiconductor laminated portion constituted by laminating a first semiconductor layer including an n-type AlGaN semiconductor layer, an active layer including an AlGaN semiconductor layer, and a second semiconductor layer including a p-type AlGaN semiconductor layer, an n-electrode constituted by one or more metal layers, a p-electrode constituted by one or more metal layers, a protective insulating film, a first plated electrode that contacts an exposed surface of the p-electrode that is not covered by the protective insulating film, a second plated electrode that contacts an exposed surface of the n-electrode that is not covered by the protective insulating film, and a fluororesin film,
in each of the element units,
when it is assumed that a region occupied by one element unit in a plane parallel to a surface of the semiconductor laminated portion is an element region, the semiconductor laminated portion is formed so as to laminate the active layer and the second semiconductor layer on the first semiconductor layer in a first region that is a part of the element region and to expose the first semiconductor layer in a second region other than the first region in the element region,
the n-electrode is formed on an exposed surface of the first semiconductor layer in the second region,
the p-electrode is formed on a uppermost surface of the second semiconductor layer,
the protective insulating film is formed to cover at least an entire outer circumferential side surface of the semiconductor laminated portion in the first region, an upper surface of the first semiconductor layer between the first region and the n-electrode, and upper and side surfaces of the n-electrode including at least a portion of an outer circumferential edge part of the n-electrode opposing the first region and not to cover but to expose at least a part of a surface of the n-electrode and at least a part of a surface of the p-electrode,
each of the first plated electrode and the second plated electrode is constituted by a main body electrode composed of copper or an alloy containing copper as a main component and a single-layer or multi-layer surface metal film in which an outermost layer covering an upper surface and a side wall surface of the main body electrode is composed of gold or a platinum group metal,
the first plated electrode is formed to be spaced apart from the second plated electrode and to cover an entire upper surface of the first region including an exposed surface of the p- electrode, an entire outer circumferential side surface of the first region covered by the protective insulating film, and a boundary region that is a part of the second region and contacts the first region, and wherein
the fluororesin film continuously covers at least a part of a side wall surface of the first plated electrode other than an upper end part, a part of a side wall surface of the second plated electrode other than an upper end part, and a part of an exposed surface of the protective insulating film exposed on a gap part between the first plated electrode and the second plated electrode other than an outer circumferential end, according to the method comprising:
after forming the semiconductor laminated portion, the n-electrode, the p-electrode, the protective insulating film, the first plated electrode, and the second plated electrode on the substrate,
forming a first mask material that blocks formation of the fluororesin film on a chip cutting region between the element regions where the plurality of element units are adjacent to each other or the chip cutting region and a side region of the chip cutting region;
applying a coating liquid containing a fluororesin composing the fluororesin film on a wafer surface having the first mask material formed thereon; and
after drying the coating liquid to form the fluororesin film, removing the first mask material and the fluororesin film formed on the first mask material.

15. The manufacturing method of a nitride semiconductor wafer according to claim 14, further comprising:
after forming the first mask material, forming a second mask material that blocks formation of the fluororesin film on upper surfaces of the first plated electrode and the second plated electrode of the element units;
after forming the first and second mask materials, injecting the fluororesin in the element region surrounded by the first mask material; and
after forming the fluororesin film, removing the first and second mask materials simultaneously or separately.

16. The manufacturing method of a nitride semiconductor wafer according to claim 15, wherein
the second mask material is composed of a resin composition that does not contain a fluororesin, and
in dissolving the second mask material by an organic solvent and removing the second mask material, if the fluororesin film is formed on the second mask material, the fluororesin film on the second mask material is simultaneously removed.

17. The manufacturing method of a nitride semiconductor wafer according to claim 14, further comprising polishing the fluororesin film formed on upper surfaces of the first plated electrode and the second plated electrode and removing the fluororesin film.

18. The manufacturing method of a nitride semiconductor wafer according to claim 14 further comprising:
using a substrate that transmits ultraviolet light as the substrate;
forming the first plated electrode so as to dispose an entire outer circumference of the first plated electrode on the n-electrode with the protective insulating film interposed therebetween;
using a negative photoresist material as the first mask material;
forming the photoresist material on an entire surface of the substrate;
then irradiating ultraviolet light from a rear surface of the substrate to expose the photoresist material; and
removing a part of the photoresist material where exposure of the ultraviolet light is blocked by the first plated electrode and the n-electrode by a development process.

19. The manufacturing method of a nitride semiconductor wafer according to claim 14, further comprising applying the first mask material on the chip cutting region by an ink-jet system.

20. The manufacturing method of a nitride semiconductor wafer according to claim 14, further comprising:
instead of or in addition to forming the first mask material,
before applying a coating liquid containing a fluororesin composing the fluororesin film,
forming a second fluororesin film that includes a second type fluororesin where a terminal functional group of a polymer or a copolymer composing a fluororesin is a reactive terminal functional group bondable to metal as a primer film of the fluororesin film on a chip cutting region between the element regions where the plurality of element units are adjacent to each other and a side region of the chip cutting region or on the side region of the chip cutting region.

* * * * *